United States Patent [19]
Nagayama

[11] Patent Number: 6,057,243
[45] Date of Patent: May 2, 2000

[54] METHOD FOR PRODUCING SEMICONDUCTOR DEVICE

[75] Inventor: Tetsuji Nagayama, Kanagawa, Japan

[73] Assignee: Sony Corporation, Tokyo, Japan

[21] Appl. No.: 09/253,950

[22] Filed: Feb. 22, 1999

[30] Foreign Application Priority Data

Feb. 23, 1998 [JP] Japan ................................. 10-040536

[51] Int. Cl.⁷ .............................................. H01L 21/311
[52] U.S. Cl. ........................ 438/700; 438/714; 438/715; 438/689; 438/709; 438/712; 438/706; 438/719
[58] Field of Search ................................... 438/700, 714, 438/689, 715, 709, 712, 706, 719

[56] References Cited

U.S. PATENT DOCUMENTS

| | | | |
|---|---|---|---|
| 4,728,618 | 3/1988 | Hirao | 437/33 |
| 5,053,849 | 10/1991 | Izawa et al. | 357/59 |
| 5,457,339 | 10/1995 | Komori et al. | 257/510 |
| 5,698,869 | 12/1997 | Yoshimi et al. | 257/192 |
| 5,972,783 | 10/1999 | Arai et al. | 438/513 |

*Primary Examiner*—William Powell
*Assistant Examiner*—Vanessa Perez-Ramos
*Attorney, Agent, or Firm*—Ronald P. Kananen; Rader, Fishman & Grauer

[57] ABSTRACT

A method for producing a semiconductor device capable of stably removing a sidewall mask layer without removal of an etching stopper film, wherein a conductive layer 30 and a first diffusion layer 11 are formed in a semiconductor substrate 10, an etching stopper film 21 is formed covering the conductive layer 30, a sidewall mask layer 31b containing silicon is formed at an upper layer of the etching stopper film 21 facing a sidewall surface of the conductive layer 30, and a second diffusion layer 12 is formed. Here, a conductive impurity is introduced into at least the sidewall mask layer 31b at either of the time of formation of the sidewall mask layer 31b or the time of formation of the second diffusion layer 12, and heat treatment for activating the conductive impurity in the sidewall mask layer 31b is applied. Next, the sidewall mask layer 31b is removed, and the insulating film 22 is formed over the entire surface at an upper layer of the etching stopper film 21, and a contact hole CH reaching the second diffusion layer 12 is formed in the insulating film 22.

9 Claims, 15 Drawing Sheets

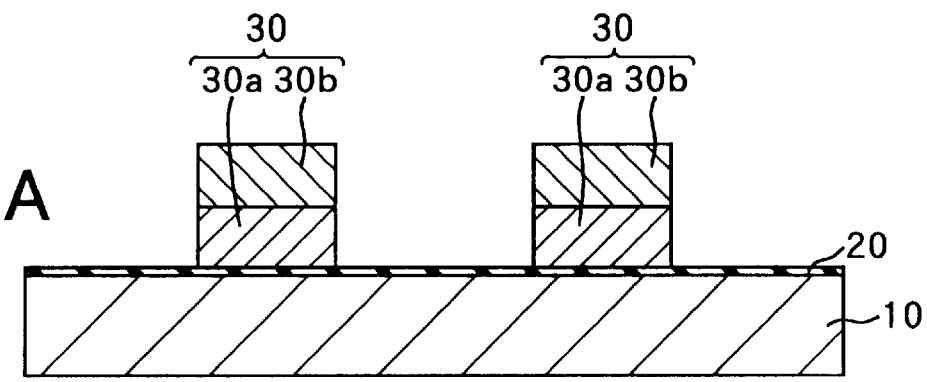
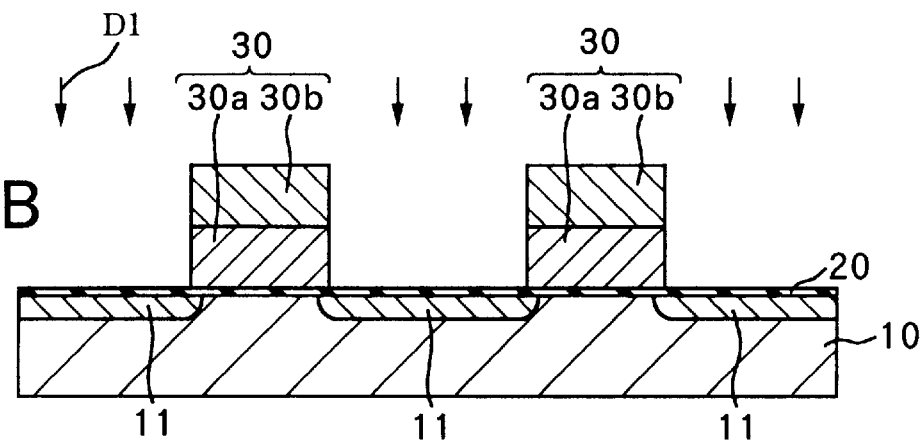
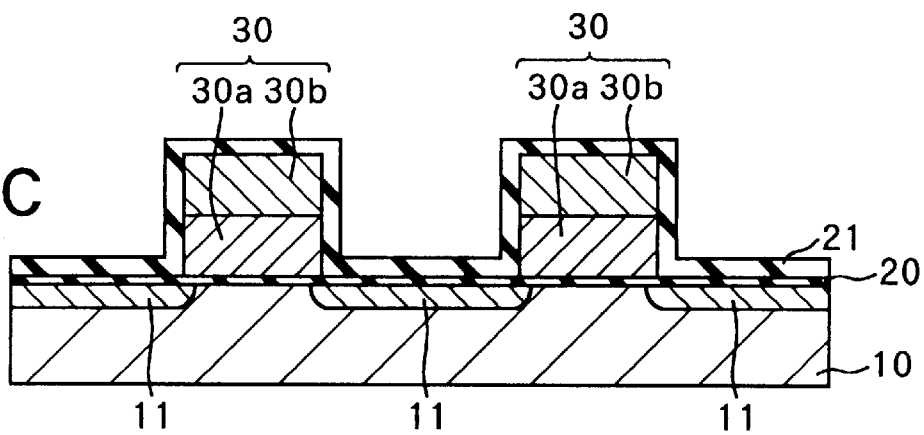

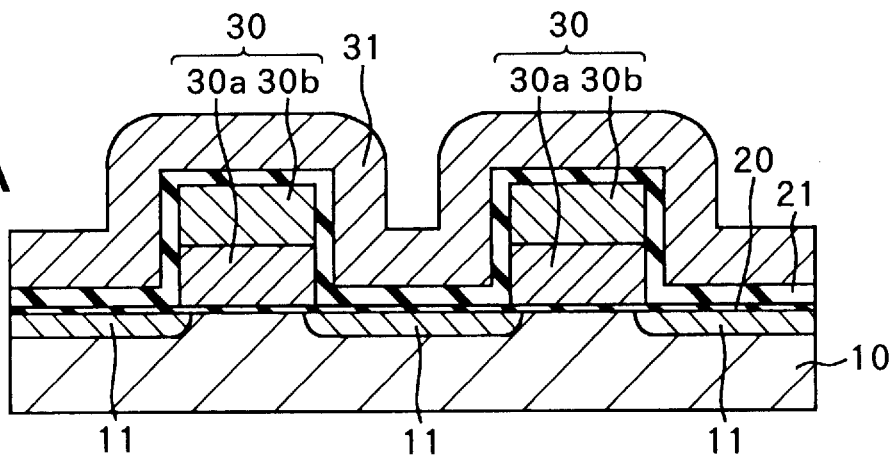
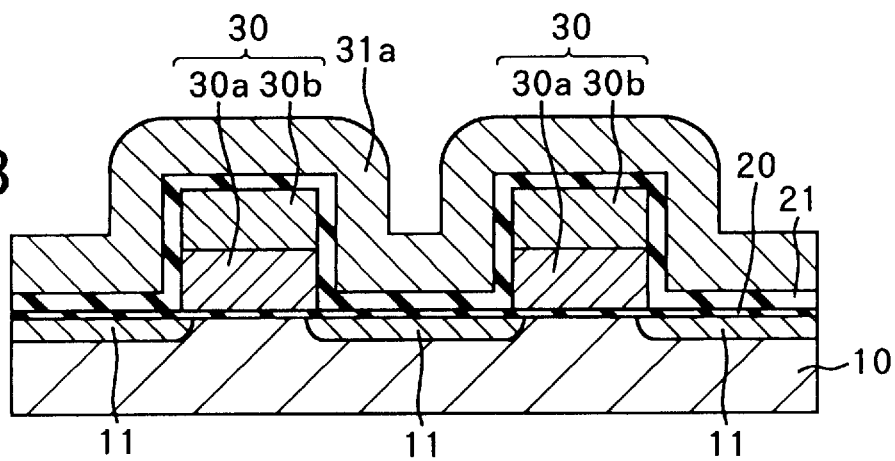
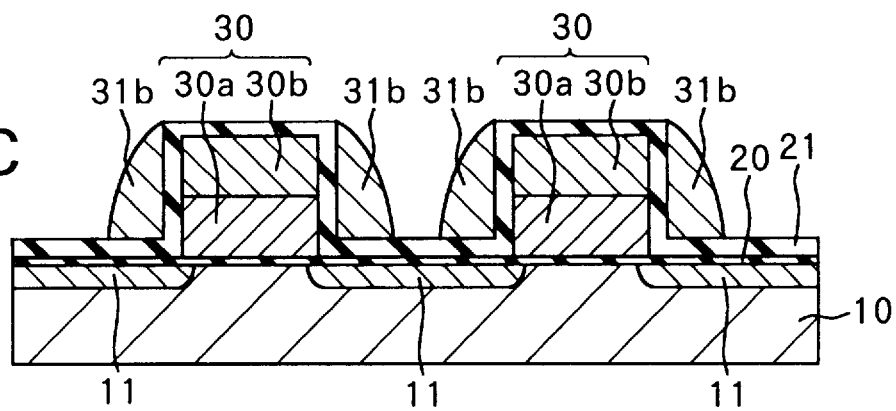

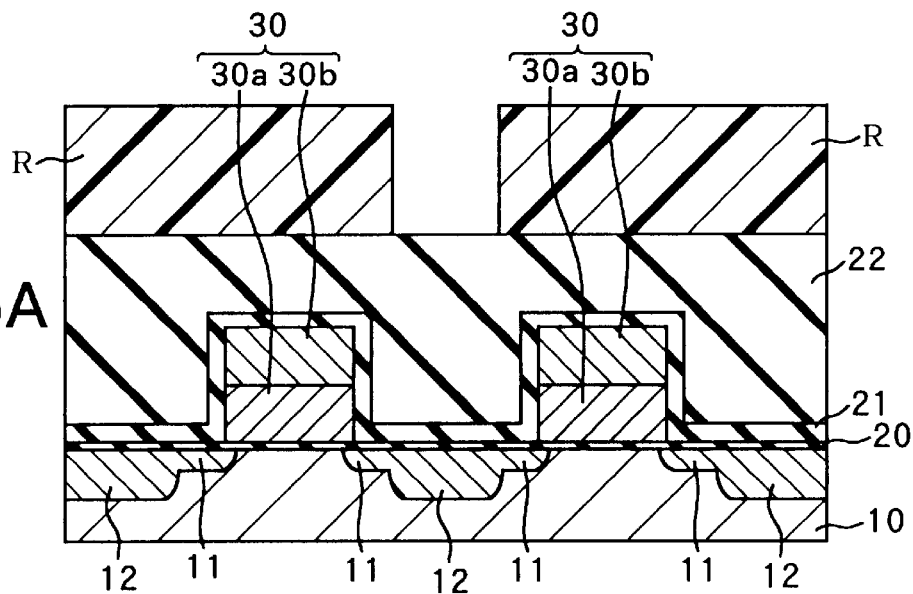
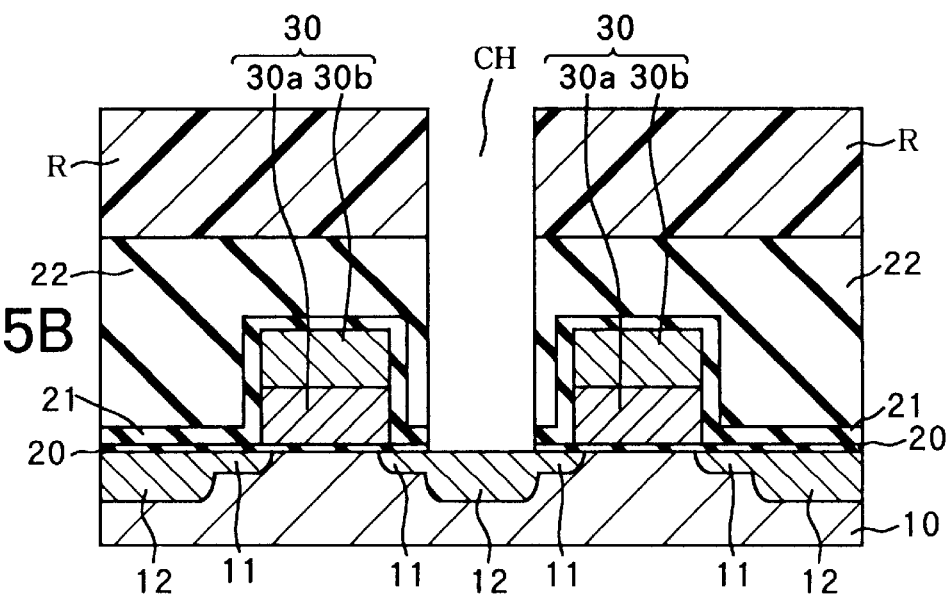

METHOD FOR PRODUCING SEMICONDUCTOR DEVICE

BACKGROUND OF THE INVENTION

1. Field of the Invention

The present invention relates to a method for producing a semiconductor device, and more particularly relates to a method for producing a semiconductor device having fine contacts.

2. Description of the Related Art

Along with the advances made in higher integration and enhancement of performance of semiconductor devices as seen in very large scale integrated circuits (VLSI) etc. in recent years, the associated technical factors have been becoming increasingly stringent including factors such as dry etching of silicon oxide ($SiO_2$)-based material layers.

In the midst of all of this, the self aligned contact (hereinafter abbreviated as SAC) technique which eliminates the need for a design margin on the mask for positioning of contact holes is attracting attention.

There has been active development of the SAC technique particularly in the 0.25 μm rule generation and on. There are several reasons behind this. One is the limitation due to the performance of the exposure apparatus, while another is the positive reduction of chip and cell areas made possible by the use of SAC.

Particularly, the former means that it has become difficult to maintain the trend toward miniaturization of interconnection layers using the recently announced 0.25 μm rule for mass production use exposure apparatuses. This is caused by the insufficient improvement of precision of positioning in steppers. Since the error in positioning is large, the design margin of the positioning also is large. As a result, the interconnections become wider or openings cannot be formed since the hole diameters become too small. Signs of this had already started to be seen from the 0.3 μm rule. This problem cannot be avoided in the 0.25 to 0.2 μm rules.

The technique which reportedly could eliminate the need for a design margin in positioning is SAC. There are several methods for SAC formation. All of them generally have the defect that the process becomes somewhat more complex in comparison with a related art method using only exposure. However, adoption of SAC is indispensable in the future. Various studies have been made concerning SAC.

An explanation will next be made of an example of the method of SAC formation with reference to FIGS. 1A and 1B. First, an explanation will be made of the semiconductor device shown in FIG. 1A. At an upper layer of a silicon semiconductor substrate 10, a gate electrode 30 comprising a lower gate electrode 30a of polycrystalline silicon and an upper gate electrode 30b of a tungsten silicide is formed via a gate insulating film 20, an offset insulating film 24 of a silicon oxide is formed at an upper layer thereof, and sidewall mask layers 25 (acting as spacers for forming a lightly doped drain (LDD) diffusion layer mentioned later) of silicon oxide are formed at the two side portions of the gate electrode 30 Further, in the semiconductor substrate 10 at the two side portions of the gate electrode 30, an LDD diffusion layer 11 containing a conductive impurity at a low concentration and a source and drain diffusion layer 12 containing them at a high concentration are formed, and a MOS field effect transistor is formed as described above. Further, an etching stopper film 21 made of for example a silicon nitride ($Si_3N_4$) is formed over the entire surface by covering the offset insulating film 24 and the sidewall mask layer 25. At an upper layer thereof, an insulating film 22 of for example silicon oxide is formed.

When forming a contact hole in the semiconductor device, as shown in FIG. 1B, the contact hole CH is formed by forming a resist film R of a contact hole pattern at an upper layer of the insulating film 22 and etching the same by for example reactive ion etching (RIE). At this time, the etching is stopped once at a point of time when the etching stopper film 21 is exposed, then etching is carried out again under different conditions from those of the above etching to form a contact hole reaching the semiconductor substrate 10. According to this method, the number of exposure steps is not increased in comparison with the method of the related art not using SAC, therefore the rise in costs is relatively small. Further, the gate electrode 30 is covered by the etching stopper film 21 of silicon nitride, so the design margin of the positioning becomes unnecessary and it becomes possible to positively reduce the surface area of the chip and cell.

However, in order to put SAC using silicon nitride into practical use, it becomes necessary to develop a highly complex etching technique. At this time, it is necessary to cause the etching to stop at the thin silicon nitride film (etching stopper film 21) by using etching having a high selectivity with respect to silicon nitride, but as shown in for example FIG. 1B, a CF-based deposit 26 will be formed at the bottom portion of the contact hole during the etching. This CF-based deposit 26 is hard to be removed by etching. When the cell area is reduced and the distance between the gate electrodes 30 is reduced, a large amount of CF-based deposit 26 is formed causing an extreme microloading effect referred to as an "etch stop", thus it becomes impossible to form a contact hole.

In order to avoid this problem, the SAC structure shown in FIGS. 2A and 2B has been developed. First, an explanation will be made of the semiconductor device with reference to FIG. 2A. At the upper layer of the silicon semiconductor substrate 10, a gate electrode 30 comprising a lower gate electrode 30a of polycrystalline silicon and an upper gate electrode 30b of tungsten silicide is formed via a gate insulating film 20, an offset insulating film 24 of silicon nitride is formed at an upper layer thereof, and sidewall mask layers 25 of silicon nitride are formed in the two side portions of the gate electrode 30. Further, in the semiconductor substrate 10 at the two side portions of the gate electrode 30, an LDD diffusion layer 11 containing a conductive impurity at a low concentration and a source and drain diffusion layer 12 containing them at a high concentration are formed and a MOS field effect transistor is formed as described above. At an upper layer thereof, an insulating film 22 of for example silicon oxide is formed. In this structure, the offset insulating film 24 and the sidewall mask layer 25 are formed by silicon nitride and are made to act also as etching stopper films.

When forming a contact hole in the semiconductor device, as shown in FIG. 2B, a resist film R of the contact hole pattern is formed at an upper layer of the insulating film 22, then etched by, for example, RIE (reactive ion etching) to form the contact hole CH. At this time, it becomes possible to form a sufficiently stable SAC by the difference in thickness of the offset insulating film 24 and the sidewall mask layer 25 acting as the etching stopper films from the etching stopper film of the semiconductor device shown in FIGS. 1A and 1B even if the selectivity with respect to silicon nitride is not excessively increased. However, in this structure as well, in the 256 Mb dynamic random access memory (DRAM) class generation, the distance between gate electrodes is short, the opening portion exhibits a slit state, and the risk of etch stop is no longer much different from that of the semiconductor device shown in FIGS. 1A and 1B.

In order to solve the problem of etch stop, a method of removing the sidewall mask layer making the distance between the gate electrodes narrow after forming the diffusion layer of the LDD structure has been developed.

An explanation will next be made of the method for removing the sidewall mask layer by referring to FIGS. 3A and 3B. First, an explanation will be made of the semiconductor device with reference to FIG. 3A. At an upper layer of a silicon semiconductor substrate 10, a gate electrode 30 comprising a lower gate electrode 30a of polycrystalline silicon and an upper gate electrode 30b of tungsten silicide are formed via a gate insulating film 20. By covering the gate electrode 30, an etching stopper film 21 of for example silicon oxide is formed. Silicon-based sidewall mask layers 31c are formed at both side portions of the gate electrode 30 via this etching stopper film 21. This becomes the spacer for forming the LDD diffusion layer mentioned later. In the semiconductor substrate 10 at the two side portions of the gate electrode 30, an LDD diffusion layer 11 containing a conductive impurity at a low concentration and a source and drain diffusion layer 12 containing them at a high concentration are formed, and a MOS field effect transistor is formed as described above.

The semiconductor device is etched by for example plasma etching of the down flow type to selectively remove the sidewall mask layer 31c controlling the ratio of etching rate between the sidewall mask layer 31c and the etching stopper film 21. In the following steps, usually a thick inter-layer insulating film made of for example silicon oxide is formed over the entire surface covering the transistor, a contact hole penetrating through the inter-layer insulating film and reaching the semiconductor substrate 10 is formed, a plug is filled in the contact hole, an upper layer interconnection is formed, and so on to form the intended semiconductor device.

In forming the contact hole, even if the distance between the gate electrodes 30 becomes narrower by removing the sidewall mask layer 31c, there is no longer any obstacle in the SAC or other contact opening portion and the etch stop can be prevented. Further, the etching stopper film 21 is formed by covering an active region of the semiconductor substrate 10 and an element isolation region such as a not illustrated local-oxidation-of-silicon (LOCOS) film. Therefore, when removing the sidewall mask layer 31c, there is little chance of damage due to the etchant ions directly abutting against the semiconductor substrate or etching of the "bird's beak" etc. of the LOCOS film, which greatly contributes to improvement of device characteristics such as the leak current. As the sidewall mask layer which can be removed, those other than a silicon-based layer are also possible.

However, in the method for removing the sidewall mask layer as described above, there is the following problem. This will be explained by referring to FIGS. 3A and 33. As shown in the semiconductor device illustrated in FIG. 3A, after forming the sidewall mask layer 31c, the sidewall mask layer 31c acting as the LDD spacer is used as a mask to ion-implant a conductive impurity of a high concentration into the semiconductor substrate 10 and form the source and drain diffusion layer 12. The impurity ions at this time penetrate through the etching stopper film 21 and are implanted into the substrate. If the etching stopper film 21 is made thin in order to enhance the control of the ion implantation at this time, then when the sidewall mask layer 31c is removed by isotropic etching or the like, part of the etching stopper film 21 is removed before the removal of the sidewall mask layer 31c is terminated as shown in FIG. 3B. That is, irrespective of the fact that an etching remainder 31d exists, part of the etching stopper film 21 is removed, an opening portion H penetrating to the substrate 10 is formed, and a gouge in the substrate 10 is sometimes created.

The above problem occurs more conspicuously if an amorphous silicon excellent in step coverage is used as the sidewall mask layer since an amorphous silicon has a slow etching rate.

SUMMARY OF THE INVENTION

The present invention was made in consideration of the above circumstance. Accordingly, an object of the present invention is to provide a method for producing a semiconductor device using an etching stopper film and a silicon-based sidewall mask layer leading to dual usage with SAC and improvement of the device characteristics and capable of stably removing the sidewall mask layer.

According to the present invention, there is provided a method for producing a semiconductor device comprising the steps of forming a conductive layer in a semiconductor substrate; forming a first diffusion layer containing a conductive impurity at a first concentration in the semiconductor substrate by ion implantation using the conductive layer as a mask; forming an etching stopper film covering the conductive layer; forming a sidewall mask layer containing silicon over the etching stopper film facing the sidewall surface of the conductive layer; forming a second diffusion layer containing a conductive impurity at a second concentration higher than the first concentration and connecting to the first diffusion layer in the semiconductor substrate by ion implantation using the sidewall mask layer as a mask; removing the sidewall mask layer selectively by etch controlling the ratio of etching rate between sidewall mask layer and the etching stopper film; forming an insulating film over the etching stopper film; and forming a contact hole reaching the second diffusion layer though the insulating film, at least the step of forming a sidewall mask layer or the step of forming a second diffusion layer including a step of introducing a conductive impurity into the sidewall mask layer; and further comprising a heat treatment step for activating the conductive impurity in the sidewall mask layer before the step of removing the sidewall mask layer.

The method for producing a semiconductor device according to the above invention comprises forming a conductive layer in a semiconductor substrate; performing ion implantation using the conductive layer as a mask; forming a first diffusion layer containing a conductive impurity at a low concentration in the semiconductor substrate; forming an etching stopper film covering the conductive layer; forming a sidewall mask layer containing silicon over the etching stopper film facing the sidewall surface of the conductive layer; performing ion implantation using the sidewall mask layer as a mask; and forming a second diffusion layer containing a conductive impurity at a second concentration higher than the first concentration and connecting to the first diffusion layer in the semiconductor substrate. Here, the conductive impurity is introduced into at least the sidewall mask layer and heat treatment is performed for activating the conductive impurity in the sidewall mask layer either at the time of formation of the sidewall mask layer or at the time of formation of the second diffusion layer. Next, the sidewall mask layer is removed by etch selectivity with respect to the etching stopper film. Next, an insulating film is formed over the entire surface at an upper layer of the etching stopper film and a contact hole reaching the second diffusion layer is formed in the insulating film.

When etching a silicon-based material by a halogen based or other etchant gas, the etching rate changes according to the content of the impurity in the silicon-based material or the degree of activation. This phenomenon conspicuously appears when etching for example a phosphorus-doped silicon by a chlorine-containing gas. In the method for producing a semiconductor device of the present invention, by applying the heat treatment before removing the sidewall mask layer and activating the impurity in the sidewall mask layer, it becomes possible to raise the etching rate of the sidewall mask layer. By this, when removing the sidewall mask layer, the gouging of the semiconductor substrate due to the removal of part of the etching stopper film before the removal of the sidewall mask layer is terminated or further removal of part of the etching stopper film to form an opening portion penetrating to the semiconductor substrate can be prevented and stable removal of the sidewall mask layer becomes possible. Further, it is possible to simultaneously densify the etching stopper film by this heat treatment and to raise the etch selectivity of the sidewall mask layer with respect to the etching stopper film. The timing of applying this heat treatment should be before the step of removal of the sidewall mask layer after the step of forming the sidewall mask layer and is not particularly limited.

The content of the impurity in the sidewall mask layer made of a silicon-based material or the degree of activation can be controlled by the film-forming conditions. For example, when introducing phosphorus, the content of the phosphorus can be controlled by the flow rate of $PH_3$ contained in the starting material gas and the degree of the activation can be controlled by the film-forming temperature.

Preferably, the step of forming a sidewall mask layer includes a step of forming a sidewall mask layer containing a conductive impurity therein. As a conductive impurity contributing to the improvement of the etching rate of the sidewall mask layer through heat treatment, a conductive impurity which is introduced into the sidewall mask layer at the time of formation of the second diffusion layer etc. is also effective, but by forming the sidewall mask layer containing a conductive impurity in the layer in the step for forming that layer, it becomes possible to handle even regions where it is not desired to introduce a conductive impurity when forming the second diffusion layer etc.

Preferably, the treatment temperature in the heat treatment step is higher than the film-forming temperature of the step of forming a sidewall mask layer. Due to this, it becomes possible to sufficiently activate the impurity in the sidewall mask layer and improve the etching rate. For example, when forming the sidewall mask layer by amorphous silicon, the film-forming temperature is usually not more than 600° C. The heat treatment for activating the impurity in the sidewall mask layer is preferably performed at over 600° C.

Preferably, the step of forming a sidewall mask layer includes a step of forming a sidewall mask use layer over the etching stopper film and a step of etching back the sidewall mask use layer leaving the sidewall mask use layer at a portion facing the sidewall surface of the conductive layer. Due to this, it is possible to form a sidewall mask layer at a position facing the sidewall surface of the conductive layer.

Preferably, the step of forming a sidewall mask use layer includes a step of forming a sidewall mask use layer containing a conductive impurity therein. Due to this, it becomes possible to control the etching rate in regions where it is not desired to introduce a conductive impurity when forming the second diffusion layer etc.

Preferably, the treatment temperature in the heat treatment step is higher than the film-forming temperature of the step of forming a sidewall mask use layer. Due to this, it becomes possible to sufficiently activate the sidewall mask layer or the impurity in the sidewall mask layer and raise the etching rate.

Preferably, the step of forming a sidewall mask layer includes a step of forming a sidewall mask layer of amorphous silicon. Amorphous silicon has an excellent step coverage at the time of deposition. It is possible to form a sidewall mask layer with an excellent shape. On the other hand, since the etching rate is slow, when removing the sidewall mask layer by etching, while there had been the problem of part of the etching stopper film being removed before the sidewall mask layer was fully removed, in the method for producing a semiconductor device of the present invention, it becomes possible to apply heat treatment before removing the sidewall mask layer so as to activate the impurity in the sidewall mask layer and raise the etching rate.

Preferably, the heat treatment step includes a step of activating the conductive impurity in at least one of the first diffusion layer and the second diffusion layer. Due to this, there is no need to newly provide a heat treatment step for activating the impurity in the sidewall mask layer, the number of steps is not increased, and a rise in the manufacturing costs can be suppressed.

Preferably, the method for producing a semiconductor device described above further comprises a step of forming a channel formation region in the semiconductor substrate and a step of forming a gate insulating film over the semiconductor substrate before the step of forming a conductive layer in the semiconductor substrate, the step of forming a conductive layer includes a step of forming a conductive layer over the gate insulating film, and the step of forming a field effect transistor using the conductive layer as a gate electrode. It is possible to form a MOS field effect transistor from the gate insulating film at an upper layer of the channel formation region, the conductive layer (gate electrode), and first diffusion layer and second diffusion layer (source and drain diffusion layer) contacting the channel formation region.

BRIEF DESCRIPTION OF THE DRAWINGS

The above and other objects and features of the present invention will be more apparent from the following description of the preferred embodiments given with reference to the accompanying drawings, wherein:

FIGS. 1A and 1B are sectional views of production steps of a method for producing a semiconductor device according to a first related art, in which FIG. 1A shows a device up to the step of formation of the inter-layer insulating film; and FIG. 1B shows a device up to the step of forming the contact hole;

FIGS. 2A and 2B are sectional views of production steps of a method for producing a semiconductor device according to a second related art, in which FIG. 2A shows a device up to the step of formation of the inter-layer insulating film; and FIG. 2B shows a device up to the step of forming the contact hole;

FIGS. 3A and 3B are sectional views of production steps of a method for producing a semiconductor device according to a third related art, in which FIG. 3A shows a device up to the step of formation of the source and drain diffusion layer; and FIG. 3B shows a device up to the step of removal of the sidewall mask layer;

FIGS. 5A to 5C are sectional views of production steps in a method for producing a semiconductor device according to the first and second embodiments, in which FIG. 5A shows a device up to a step of formation of a gate electrode; FIG. 5B shows a device up to a step of formation of an LDD diffusion layer; and FIG. 5C shows a device up to a step of formation of an etching stopper film;

FIGS. 7A to 7C show steps following that of FIG. 5C, in which FIG. 7A shows a device up to the step of formation of a sidewall mask use layer; FIG. 7B shows a device up to a heat treatment step; and FIG. 7C shows a device up to the step of formation of the sidewall mask layer;

FIGS. 8A to 8C show steps following that of FIG. 7C, in which FIG. 8A shows a device up to the step of formation of a source and drain diffusion layer; FIG. 8B shows a device up to a step of removal of the sidewall mask layer; and FIG. 8C shows a device up to a step of formation of an inter-layer insulating film;

FIGS. 10A and 10B show steps following that of FIG. 8C, in which FIG. 10A shows a device up to the step of formation of a resist film of a contact hole pattern; and FIG. 10B shows a device up to a step of forming a contact hole;

FIGS. 12A to 12C are sectional views of production steps of methods for producing a semiconductor device according to third and fourth embodiments, in which FIG. 12A shows a device up to the step of formation of the gate electrode; FIG. 12B shows a device up to the step of formation of the LDD diffusion layer; and FIG. 12C shows a device up to the step of formation of the etching stopper film;

FIGS. 13A to 13C show steps following that of FIG. 12C, in which FIG. 13A shows a device up to the step of formation of the sidewall mask use layer; FIG. 13B shows a device up to the step of formation of the sidewall mask layer; and FIG. 13C shows a device up to the heat treatment step;

FIGS. 14A to 14C shows steps following that of FIG. 13C, in which FIG. 14A shows a device up to the step of formation of the source and drain diffusion layer; FIG. 14B shows a device up to the step of removal of the sidewall mask layer; and FIG. 14C shows a device up to the step of formation of the inter-layer insulating film; and FIGS. 15A and 15B shows steps following that of FIG. 14C, in which FIG. 15A shows a device up to the step of formation of the resist film of the contact hole pattern; and FIG. 15B shows a device up to the step of forming the contact hole.

DESCRIPTION OF THE PREFERRED EMBODIMENTS

Below, an explanation will be made of preferred embodiments of the present invention with reference to the drawings.

First Embodiment

Figure 1A:
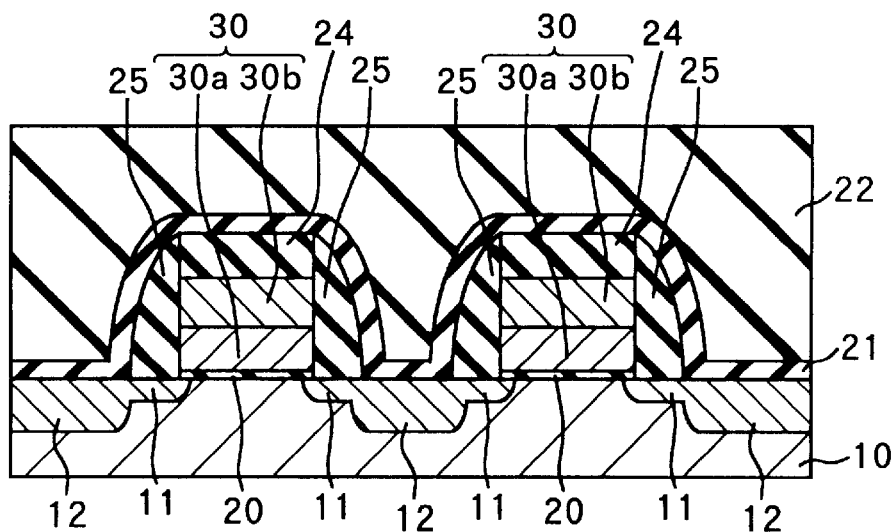
Figure 1B:
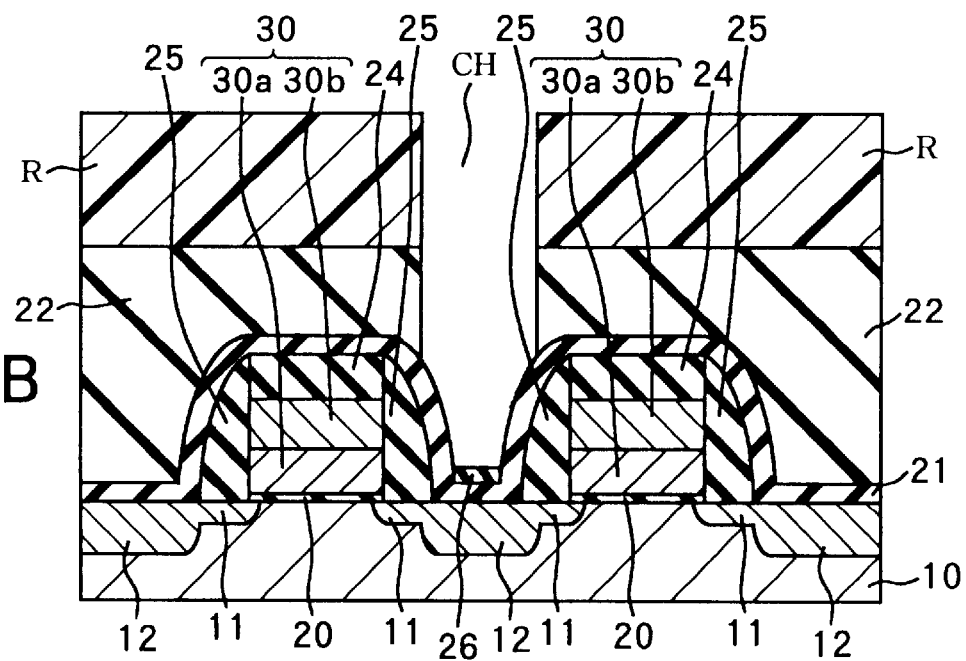
Figure 2A:
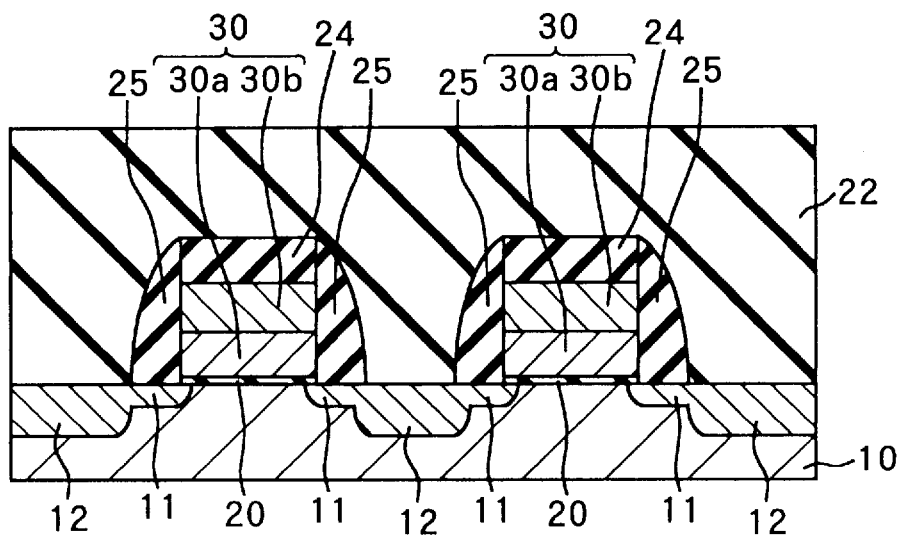
Figure 2B:
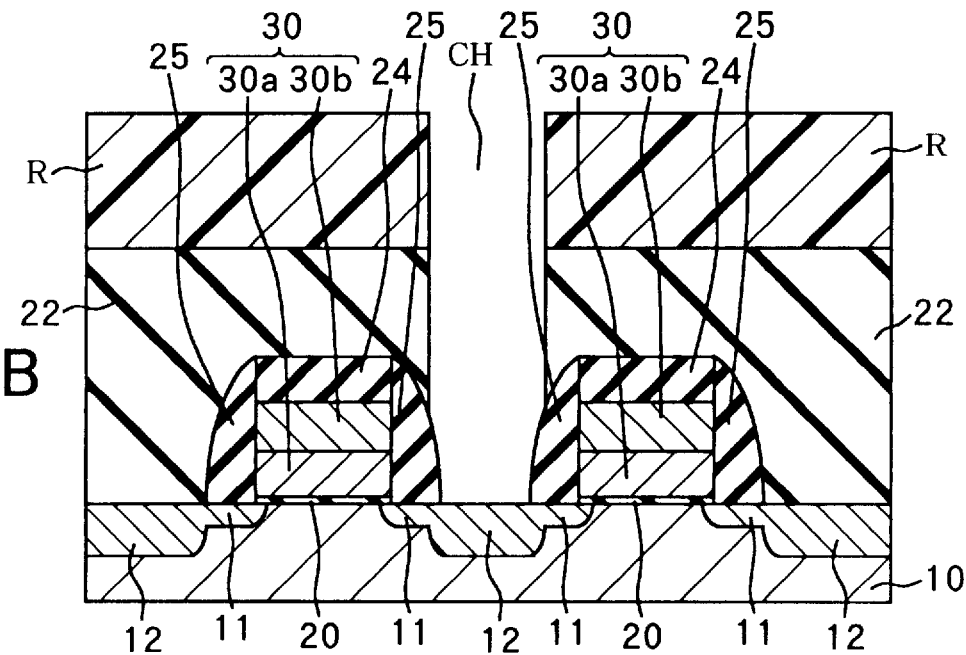
Figure 3A:
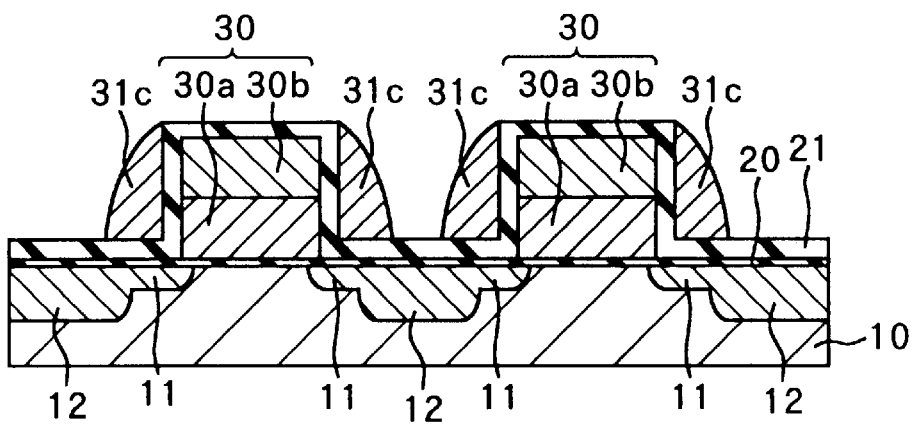
Figure 3B:
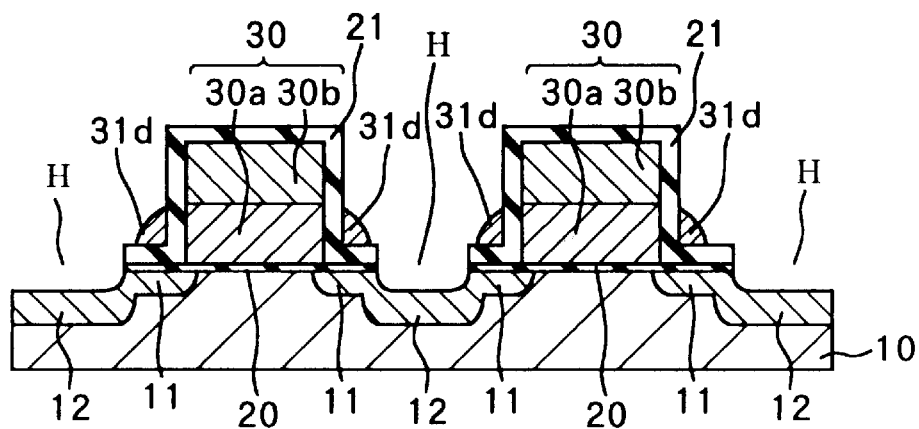
Figure 4:
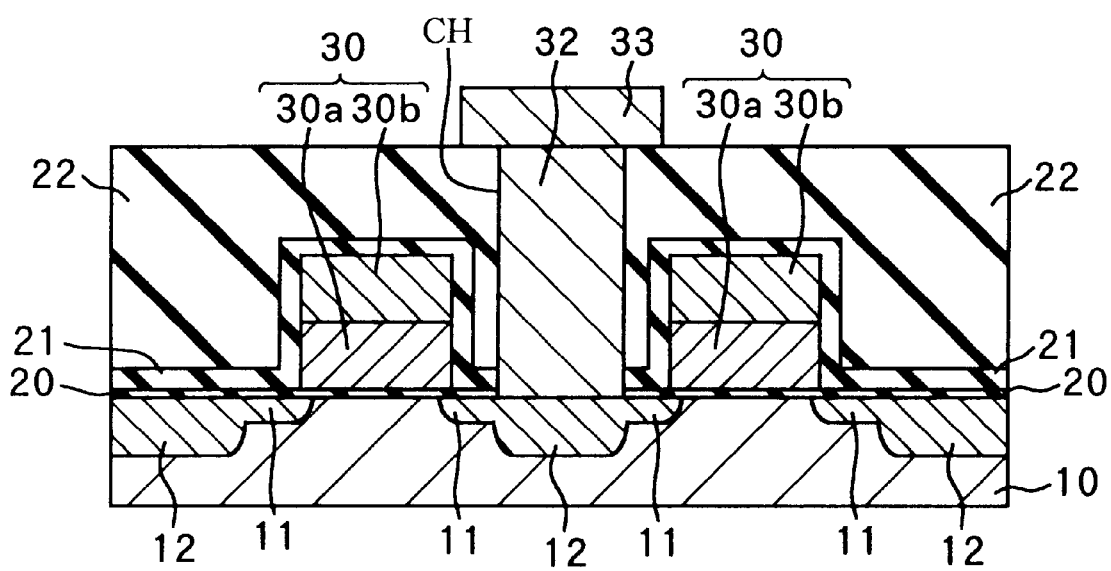
FIG. 4 is a sectional view of a semiconductor device manufactured by processes for manufacture according to first to fourth embodiments of the present invention.

A sectional view of a semiconductor device produced by a method for producing a semiconductor device according to a first embodiment of the present invention is shown in FIG. 4. In an active region of a silicon semiconductor substrate 10 surrounded by a not illustrated element isolation insulating film formed by a LOCOS process or the like, at an upper layer of the silicon semiconductor substrate 10, a gate electrode 30 comprising a lower gate electrode 30a of polycrystalline silicon and an upper gate electrode 30b of tungsten suicide is formed via a gate insulating film 20. In the semiconductor substrate 10 at the two side portions of the gate electrode 30, an LDD diffusion layer 11 containing a conductive impurity at a low concentration and a source and drain diffusion layer 12 containing it at a high concentration are formed, and a MOS field effect transistor is formed as described above.

Further, an etching stopper film 21 made of for example silicon oxide is formed over the entire surface covering the gate electrode 30. At an upper layer thereof, an inter-layer insulating film 22 of for example silicon oxide is formed. In the inter-layer insulating film 22, the etching stopper film 21, and the gate insulating film 20, a contact hole CH is formed penetrating through them. A plug 32 is filled in the contact hole CH, and an upper layer interconnection 33 is formed connected to the plug 32.

Such a semiconductor device is one which does not have a residual sidewall mask layer acting as a spacer for forming the LDD diffusion layer, which can make effective use of the region between the gate electrodes 30 for contact, which enables the chip/cell size to be reduced by making the interval between gate electrodes narrower, and which is free from the gouging etc. of the semiconductor substrate 10 due to part of the etching stopper film 21 being removed or an opening portion penetrating to the semiconductor substrate 10 being formed in the etching stopper film 21.

Below, an explanation will be made of the method for producing a semiconductor device according to the present embodiment. First, as shown in FIG. 5A, a gate insulating film 20 is formed on the silicon semiconductor substrate 10 by thermal oxidation, then polycrystalline silicon is deposited to 100 nm by for example a low pressure chemical vapor deposition (CVD) process, then for example tungsten silicide is deposited at an upper layer thereof to 100 nm by a plasma CVD process.

Next, a resist film of the desired gate pattern having a width of 0.25 $\mu$m is formed by patterning using an excimer stepper, then is etched by for example an etcher of the ECR type, a gas of $Cl_2/O_2$ at 75/6 SCCM, a pressure of 0.4 Pa, a microwave output at 2.45 GHz of 1200 W, an RF bias at 800 kHz of 70 W (first step)→50 W (second step), a wafer temperature of 20° C., and an over etch of 40% to form a gate electrode 30 of a polycide structure comprising the lower gate electrode 30a of polycrystalline silicon and the upper gate electrode 30b of tungsten silicide.

Figure 6:
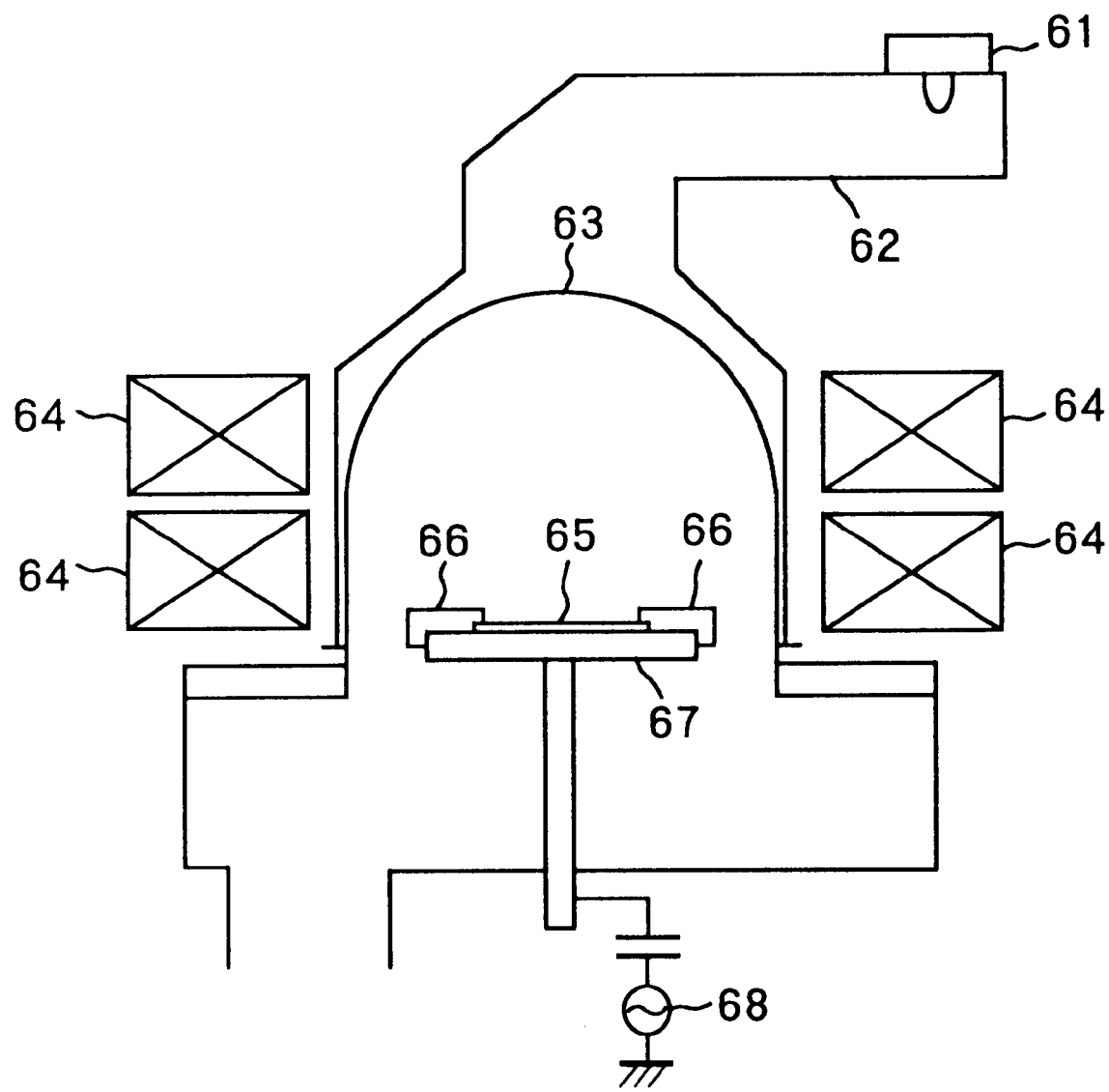
FIG. 6 is a schematic sectional view of a structure of a high density plasma etching device of an electron cyclotron resonance (ECR) type used in the present invention.

Here, an RF bias application type ECR (Electron Cyclotron Resonance) plasma etching device used in the etching step is shown in FIG. 6. This is structured so that a microwave generated by a magnetron 61 reaches a wafer 65 fixed to a clamp 66 on a wafer stage 67 surrounded by a solenoid coil 64 via a waveguide 62 and a quartz bell jar 63. Further, although not illustrated, in the etching device, the wafer stage 67, which is provided with a high frequency power supply 68, is structured with a circulating coolant (for example, trademark Fluorinert) for temperature control and, further, has a monopolar type static wafer chuck.

Next, as shown in FIG. 5B, a conductive impurity D1 is ion-implanted using the gate electrode 30 as a mask to form a LDD diffusion layer 11 containing the conductive impurity at a low concentration. For example, when forming a p-channel type MOS field effect transistor, $BF_2^+$ is ion-implanted with an implantation energy of 20 keV and a dosage of $2\times10^{13}$ cm$^{-2}$, while when forming an n-channel type MOS field effect transistor, $As^+$ is ion-implanted with an implantation energy of 40 keV and a dosage of $1\times10^{14}$ cm$^{-2}$.

Next, as shown in FIG. 5C silicon oxide is deposited to a thickness of 30 nm over the entire surface covering the gate electrode 30 by the low pressure CVD process using for example tetraethyl orthosilicate (TEOS) as the starting material to form the etching stopper film 21.

Next, as shown in FIG. 7A, phosphorus doped amorphous silicon is deposited by the low pressure CVD process by for example a batch type device (deposition temperature of 530° C. and pressure of 150 Pa) at an upper layer of the etching stopper film 21 to a thickness of 100 nm to form the sidewall mask use layer 31. The amorphous silicon can be deposited with a good step coverage. Therefore, the thickness of the sidewall mask use layer 31 in the part facing the sidewall of the gate electrode 30 becomes 100 nm.

Next, as shown in FIG. 7B, heat treatment is applied under conditions an oxygen atmosphere, a treatment temperature of 850° C., and a treatment time of 20 minutes by using a commercially available heat treatment furnace. At this time, the amorphous silicon is crystallized to become polycrystalline silicon and becomes a sidewall mask use layer 31a in which the phosphorus or other internal conductive impurity is diffused and activated. The step coverage of the amorphous silicon is held well. By this heat treatment, the etching stopper film 21 is simultaneously densified, and the conductive impurity in the LDD diffusion layer 11 is activated.

Next, as shown in FIG. 7C, the entire surface is etched back while leaving the sidewall mask use layer 31a at a position facing the sidewall portion of the gate electrode 30 by for example an etcher of the ECR type, a gas of $Cl_2$ at 100 SCCM, a pressure of 0.4 Pa, a microwave output at 2.45 GHz of 1200 W, an RF bias at 800 kHz of 80 W (first step)→30 W (second step), a wafer temperature of 20° C., and an over etching of 5% to form the sidewall mask layer 31b. At this time, the good step coverage of the sidewall mask use layer 31a is transferred, and the thickness of the sidewall mask layer 31b in the sidewall part of the gate electrode 30 becomes 100 nm.

Figure 8A:
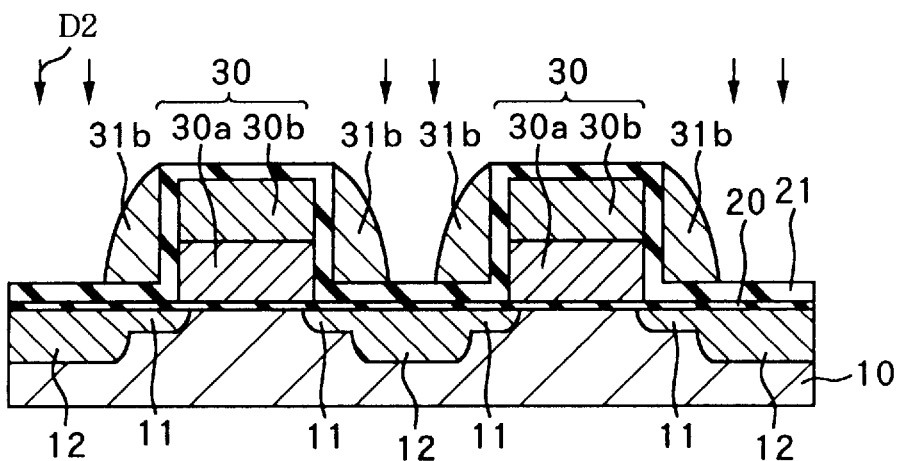

Next, as shown in FIG. 8A, a conductive impurity D2 is ion-implanted by using the sidewall mask layer 31b as a mask to form the source and drain diffusion layer 12 containing the conductive impurity at a high concentration connected to the LDD diffusion layer 11. For example, when forming a p-channel type MOS field effect transistor, $BF_2^+$ is ion-implanted with an implantation energy of 50 keV and a dosage of $1\times10^{15}$ cm$^{-2}$, while when forming an n-channel type MOS field effect transistor, $As^+$ is ion-implanted with an implantation energy of 50 keV and a dosage of $5\times10^{15}$ cm$^{-2}$.

Figure 8B:
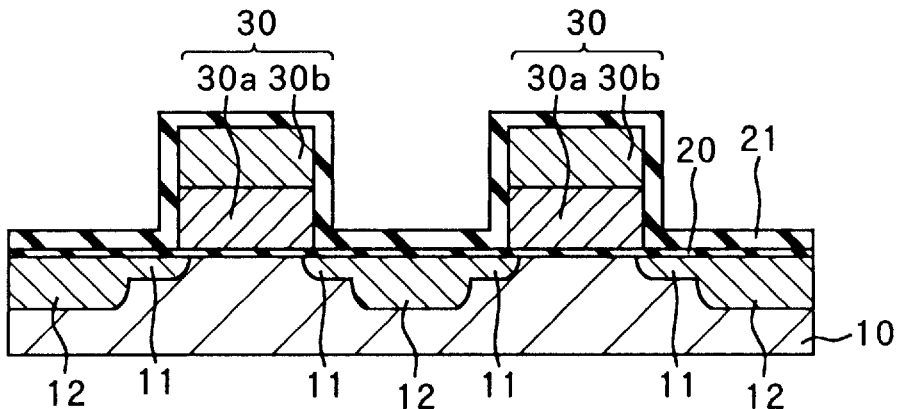

Next, as shown in FIG. 8B, the sidewall mask layer 31b is removed by etching by for example an etcher of the down flow type, a gas of $CF_4/O_2/Cl_2$ at 150/60/200 SCCM, a pressure of 40 Pa, a microwave output at 2.45 GHz of 700 W, a wafer temperature of 15° C., and an over etching of 100%. At this time, the etch selectivity of the sidewall mask layer 31b with respect to the etching stopper film 21 is raised to about three times that of the related art, for example about 100, therefore there is no gouging of the semiconductor substrate 10 due to the removal of part of the etching stopper film 21 or formation of an opening penetrating to the semiconductor substrate 10 in the etching stopper film 21.

Figure 9:
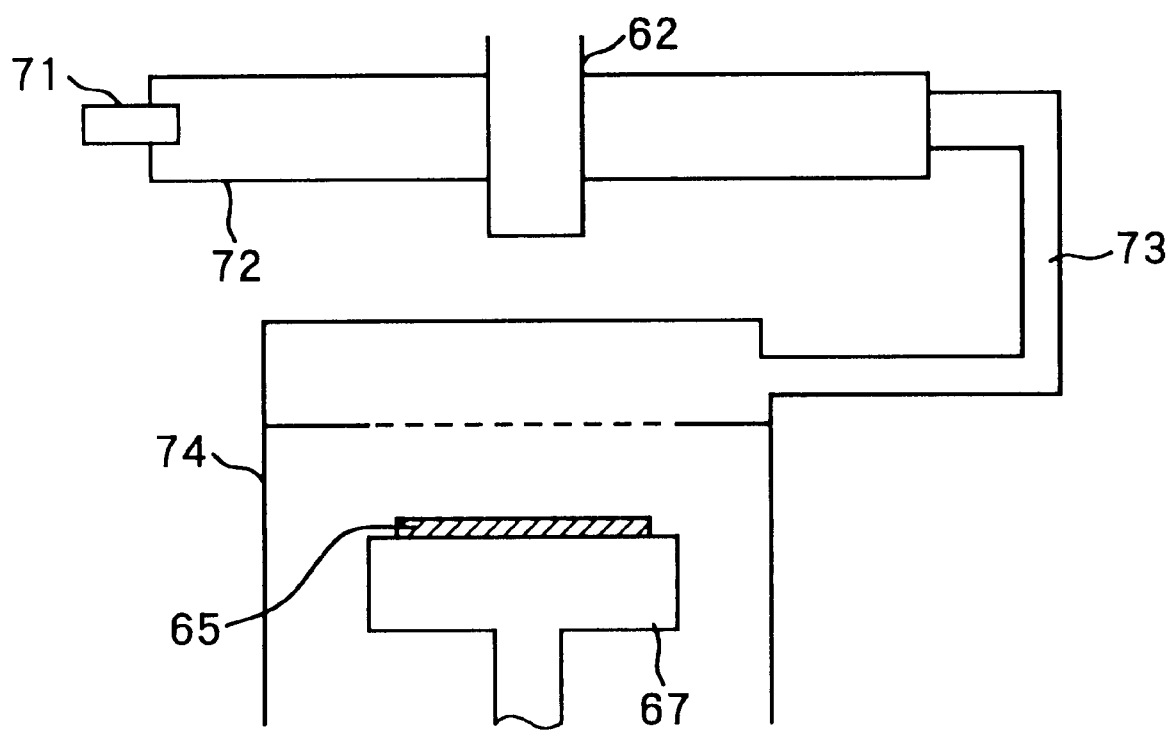
FIG. 9 is a schematic sectional view of the structure of a plasma etching device of a down flow type used in the present invention.

The down flow etching device used in the etching step is shown in FIG. 9. The microwave generated by the magnetron passes through the waveguide 62 and reaches a discharge pipe 72 and acts upon the gas from a gas introduction port 71, whereby plasma is generated in the discharge pipe 72. After this, long life radical seeds are introduced into a reaction chamber 74 via a transport pipe 73 and reach the wafer 65 on the wafer stage 67. Further, although not illustrated, in the etching device, the wafer stage 67 is structured with a circulating coolant (for example, trademark Fluorinert) for temperature control. Further, it is provided with a monopolar type static chuck.

Figure 8C:
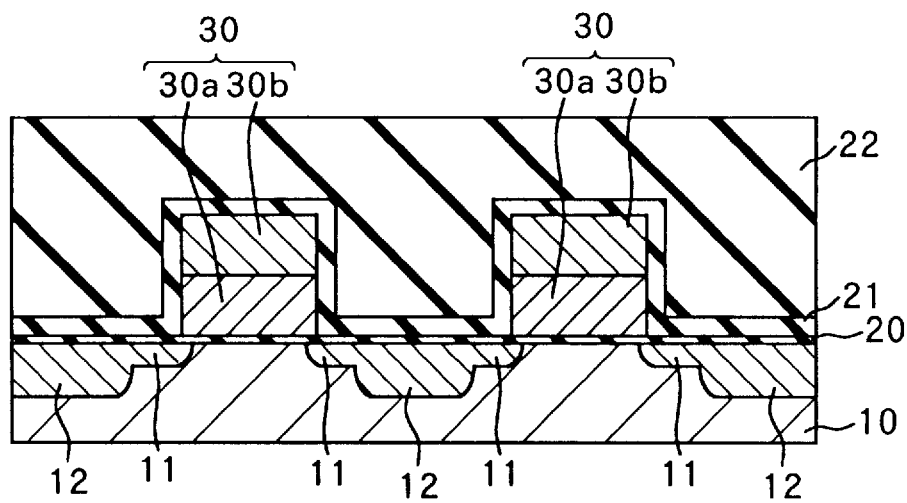

Next, as shown in FIG. 8C, silicon oxide is deposited by for example the CVD process to form the inter-layer insulating film 22. Next, the inter-layer insulating film 22 is flattened by for example a reflow, etch back, or chemical mechanical polishing (CMP) process.

Figure 10A:
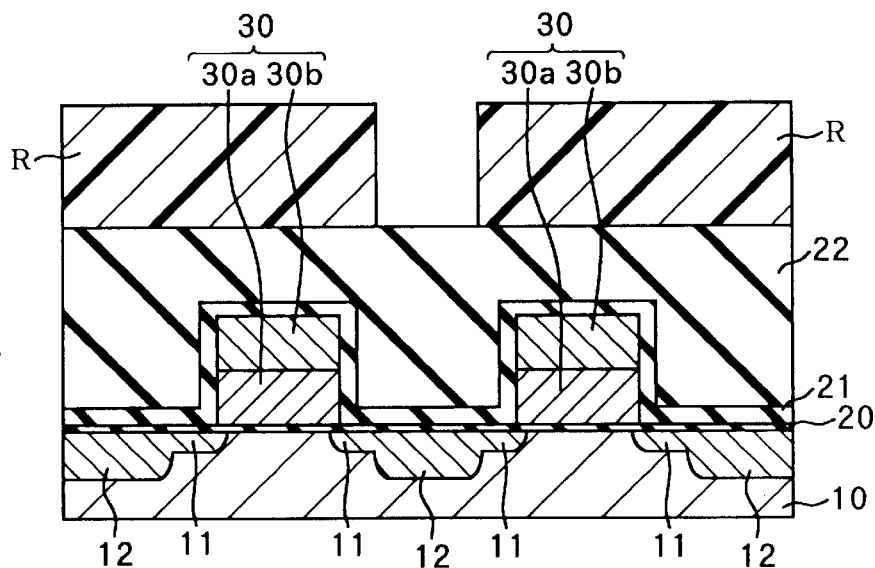

Next, as shown in FIG. 10A, a resist film R of the opening pattern of the contact hole is formed at an upper layer of the inter-layer insulating film 22 by a photolithography step.

Figure 10B:
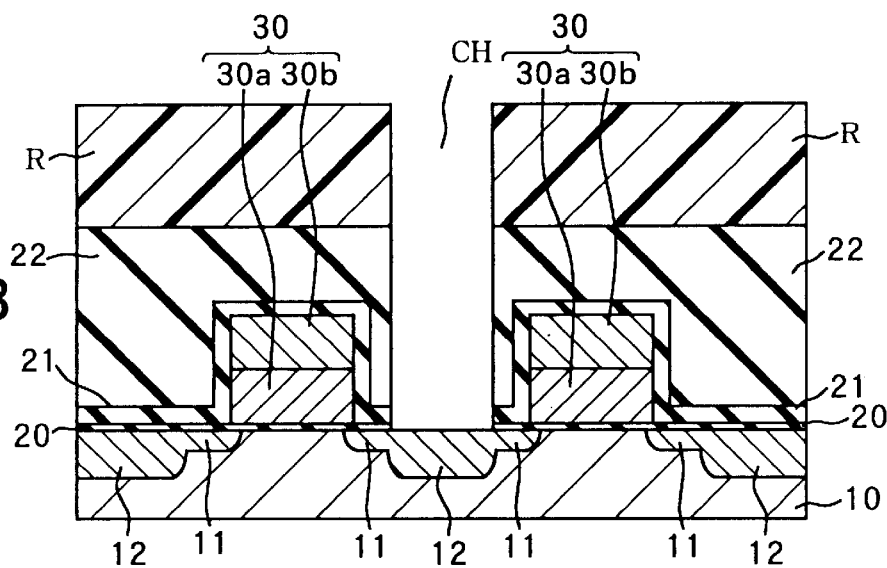

Next, as shown in FIG. 10B, etching is carried out using the resist film R as a mask by for example plasma etching of the ECR type to form the contact hole CH penetrating through the inter-layer insulating film 22, etching stopper film 21, and gate insulating film 20.

Next, a tungsten plug 32 is formed in the contact hole, then the upper layer interconnection 33 connected to the tungsten plug 32 is formed, whereby the semiconductor device shown in FIG. 4 is formed.

According to the method for producing a semiconductor device of the present embodiment, it is possible to activate the conductive impurity in the sidewall mask layer 31b by heat treatment, further densify the etching stopper film by this heat treatment, and raise the etch selectivity of the sidewall mask layer 31b controlling the ratio of etching rate between the sidewall mask layer 31b and the etching stopper film 21. Therefore, when removing the sidewall mask layer 31b, the gouging of the semiconductor substrate 10 due to part of the etching stopper film 21 being removed before the removal of the sidewall mask layer 31b is terminated or part of the etching stopper film 21 being further removed and an opening portion penetrating to the semiconductor substrate 10 being formed can be prevented, and stable removal of sidewall mask layer is possible. Further, the semiconductor substrate 10 and the not illustrated LOCOS element isolation insulating film etc. are covered by the etching stopper film 21, therefore damage due to the etchant ions directly abutting against the semiconductor substrate when removing the sidewall mask layer 31b or by etching of the bird's beak of the LOCOS film does not easily occur, so the device characteristics such as the leak current can be improved.

Second Embodiment

The semiconductor device produced by the method for producing a semiconductor device according to the second embodiment of the present invention is substantially the same as the semiconductor device according to the first embodiment shown in FIG. 4. This method of production will be explained below. First, as shown in FIG. 5A, the gate insulating film 20 is formed on the silicon semiconductor substrate 10 by thermal oxidation, then for example polycrystalline silicon is deposited to 100 nm by the low pressure CVD process, and for example tungsten silicide is deposited at an upper layer thereof to 100 nm by the plasma CVD process.

Next, a resist film of the intended gate pattern of 0.25 μm width is formed by patterning by using an excimer stepper, then is etched by for example an etcher of the ICP (Inductively coupled Plasma) type, a gas of $Cl_2/O_2$ at 100/5 SCCM, a pressure of 0.4 Pa, a source output at 13.56 MHZ of 2500 W, an RF bias at 13.56 MHZ of 100 W (first step)→50 W (second step), a wafer temperature of 60° C., and an over etching of 40% to form a gate electrode 30 of a polycide structure comprised of the lower gate electrode 30a of polycrystalline silicon and the upper gate electrode 30b of tungsten silicide.

Figure 11:
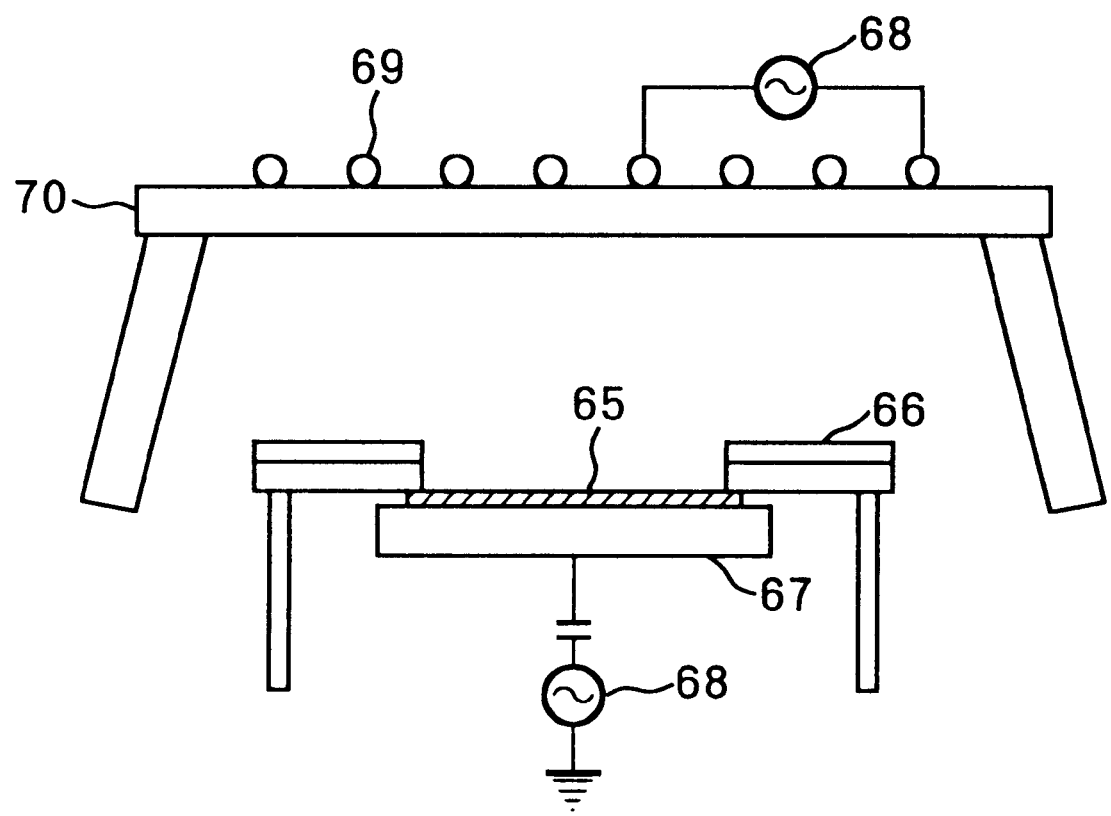
FIG. 11 is a schematic sectional view of the structure of a high density plasma etching device of an inductively coupled plasma (ICP) type used in the present invention.

The ICP type etching device used in the etching step is shown in FIG. 11. An RF bias of 13.56 MHZ is applied from the high frequency power supply 68 to an inductively coupled coil 69 formed as a spiral on a quartz plate 70. The obtained high density plasma reaches the wafer 65 fixed to the clamp 66 on the wafer stage 67. Further, although not illustrated, in the etching device, the wafer stage 67 provided with the high frequency power supply 68 is structured with a circulating coolant (for example, trademark Fluorinert) for temperature control. Further, a monopolar type static wafer chuck is provided.

Next, as shown in FIG. 5B, a conductive impurity D1 is ion-implanted by using the gate electrode 30 as a mask to form an LDD diffusion layer 11 containing the conductive impurity at a low concentration. For example, when forming a p-channel type MOS field effect transistor, $BF_2^+$ is ion-implanted with an implantation energy of 20 keV and a dosage of $2 \times 10^{13}$ $cm^{-2}$, while when forming an n-channel type MOS field effect transistor, $As^+$ is ion-implanted with an implantation energy of 40 keV and a dosage of $1 \times 10^{14}$ $cm^{-2}$.

Next, as shown in FIG. 5C, silicon oxide is deposited over the entire surface to a thickness of 30 nm covering the gate electrode 30 by the low pressure CVD process using for example TEOS as the staring material so as to form the etching stopper film 21.

Next, as shown in FIG. 7A, phosphorus-doped amorphous silicon is deposited by the low pressure CVD process by for example a batch type device (deposition temperature of 530° C. and pressure of 150 Pa) at an upper layer of the etching stopper film 21 to a thickness of 100 nm to form the sidewall mask use layer 31. Amorphous silicon can be deposited with a good step coverage, therefore the thickness of the sidewall mask use layer 31 in the part facing the sidewall of the gate electrode 30 becomes 100 nm.

Next, as shown in FIG. 7B, heat treatment is applied under a nitrogen atmosphere, treatment temperature of 1000° C., and treatment time of 10 seconds by using a commercially available rapid thermal annealing (RTA) device. At this time, the amorphous silicon is crystallized to polycrystalline silicon and becomes a sidewall mask use layer 31a in which the phosphorus or other internal conductive impurity is diffused and activated. The step coverage of the amorphous silicon is held well. By this heat treatment, the etching stopper film 21 is simultaneously densified, and the conductive impurity in the LDD diffusion layer 11 is activated.

Next, as shown in FIG. 7C, the entire surface is etched back while leaving the sidewall mask use layer 31a at a position facing the sidewall portion of the gate electrode 30 by for example an etcher of the ICP type, a gas of $Cl_2$ at 200 SCCM, a pressure of 1.0 Pa, a source output at 13.56 MHZ of 2000 W, an RF bias at 13.56 MHZ of 100 W (first step)→30 W (second step), a wafer temperature of 60° C., and over etching of 5% to form the sidewall mask layer 31b. At this time, the good step coverage of the sidewall mask use layer 31a is transferred, and the thickness of the sidewall mask layer 31b in the sidewall part of the gate electrode 30 becomes 100 nm.

Next, as shown in FIG. 8A, a conductive impurity D2 is ion-implanted by using the sidewall mask layer 31b as a mask to form the source and drain diffusion layer 12 containing the conductive impurity at a high concentration while connected to the LDD diffusion layer 11. For example, when forming a p-channel type MOS field effect transistor, $BF_2^+$ is ion-implanted with an implantation energy of 50 keV and a dosage of $1 \times 10^{15}$ $cm^{-2}$, while when forming an n-channel type MOS field effect transistor, $As^+$ is ion-implanted with an implantation energy of 50 keV and a dosage of $5 \times 10^{15}$ $cm^{-2}$.

Next, as shown in FIG. 8B, the sidewall mask layer 31b is removed by etching by for example an etcher of the down flow type, a gas of $CF_4/O_2/Cl_2$ at 150/60/200 SCCM, a pressure of 40 Pa, a microwave output at 2.45 GHz of 700 W, a wafer temperature of 15° C., and an over etching of 100%. At this time, the ratio of the etching rate of the sidewall mask layer 31b with respect to the etching stopper film 21 is raised to about three times that of the related art, for example, about 100, therefore gouging of the semiconductor substrate 10 due to the removal of part of the etching stopper film 21 or formation of an opening penetrating to the semiconductor substrate 10 in the etching stopper film 21 can be prevented.

Next, as shown in FIG. 8C, silicon oxide is deposited by for example the CVD process to form the inter-layer insulating film 22. Next, the inter-layer insulating film 22 is flattened by for example a reflow, etch back, or CMP process.

Next, as shown in FIG. 10A, a resist film R of the opening pattern of the contact hole is formed at the upper layer of the inter-layer insulating film 22 by a photolithography step.

Next, as shown in FIG. 10B, the resist film R serving as the mask is etched by for example plasma etching of the ECR type to form a contact hole CH penetrating through the inter-layer insulating film 22, etching stopper film 21, and gate insulating film 20.

Next, a tungsten plug 32 is formed in the contact hole, then the upper layer interconnection 33 connected to the tungsten plug 32 is formed, whereby the semiconductor device shown in FIG. 4 is formed.

According to the method for producing a semiconductor device of the present embodiment, in the same way as the first embodiment, it is possible to activate the conductive impurity in the sidewall mask layer 31b by the heat treatment, further densify the etching stopper film by this heat treatment, and raise the etch selectivity of the sidewall mask layer 31b controlling the ratio of etching rate between the sidewall mask layer 31b and the etching stopper film 21. Therefore, when removing the sidewall mask layer 31b, the gouging of the semiconductor substrate 10 due to part of the etching stopper film 21 being removed before the removal of the sidewall mask layer 31b is terminated or part of the etching stopper film 21 being further removed and an opening portion penetrating to the semiconductor substrate 10 being formed can be prevented and stable removal of the sidewall mask layer is possible. Further, the semiconductor substrate 10, the not illustrated LOCOS element isolation insulating film, etc. are covered by the etching stopper film 21, therefore damage due to the etchant ions directly abutting against the semiconductor substrate when removing the sidewall mask layer 31b or by etching of the bird's beak of the LOCOS film does not easily occur, so the device characteristics such as the leak current can be improved.

Third Embodiment

Figure 12A:
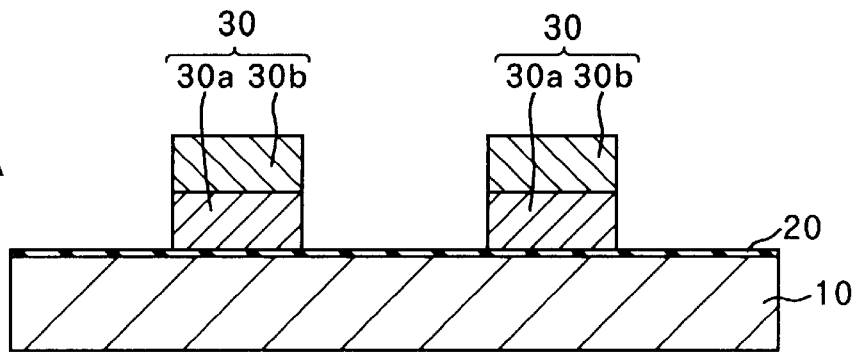

The semiconductor device produced by the method for producing a semiconductor device according to the third embodiment of the present invention is substantially the same as the semiconductor device according to the first embodiment shown in FIG. 4. Below, this production method will be explained. First, as shown in FIG. 12A, a gate insulating film 20 is formed on the silicon semiconductor substrate 10 by thermal oxidation, then for example polycrystalline silicon is deposited to 100 nm by the low pressure CVD process, and for example tungsten silicide is deposited at an upper layer thereof to 100 nm by the plasma CVD process.

Next, a resist film of the intended gate pattern of 0.25 $\mu$m width is formed by patterning by using an excimer stepper, then is etched by for example an etcher of the ECR type, a gas of $Cl_2/O_2$ at 75/6 SCCM, a pressure of 0.4 Pa, a microwave output at 2.45 GHz of 1200 W, an RF bias at 800 kHz of 70 W (first step)→50 W (second step), a wafer temperature of 20° C., and an over etching of 40% to form a gate electrode 30 of a polycide structure comprising the lower gate electrode 30a of polycrystalline silicon and the upper gate electrode 30b of tungsten suicide.

Figure 12B:
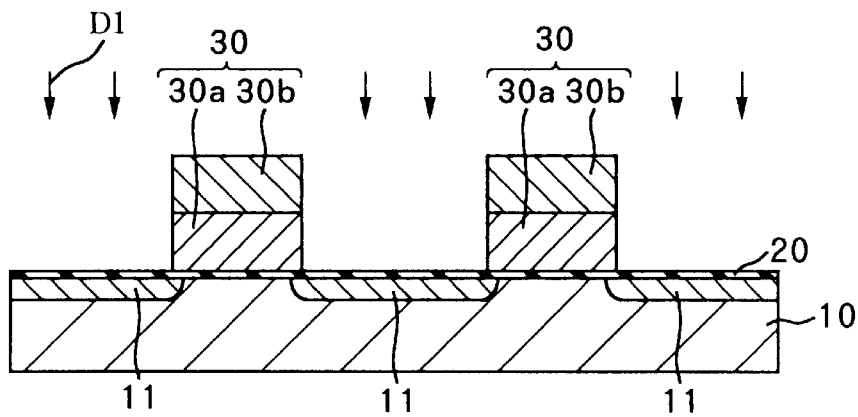

Next, as shown in FIG. 12B, a conductive impurity D1 is ion-implanted by using the gate electrode 30 as a mask to form an LDD diffusion layer 11 containing the conductive impurity at a low concentration. For example, when forming a p-channel type MOS field effect transistor, $BF_2^+$ is ion-implanted with an implantation energy of 20 keV and a dosage of $2\times10^{13}$ $cm^{-2}$, while when forming an n-channel type MOS field effect transistor, $As^+$ is ion-implanted with an implantation energy of 40 keV and a dosage of $1\times10^{14}$ $cm^{-2}$.

Figure 12C:
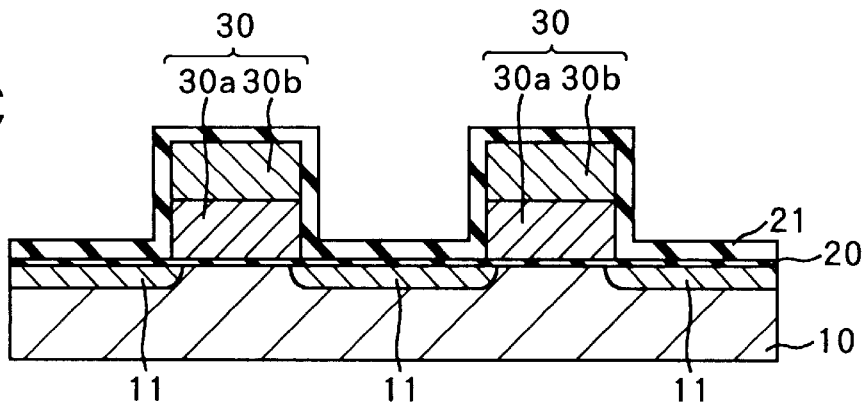

Next, as shown in FIG. 12C, silicon oxide is deposited over the entire surface to a thickness of 30 nm covering the gate electrode 30 by the low pressure CVD process using for example TEOS as the staring material to form the etching stopper film 21.

Figure 13A:
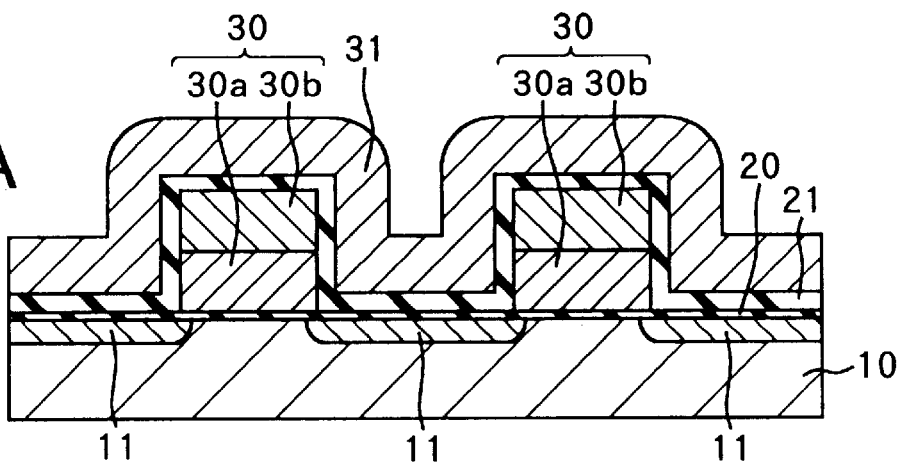

Next, as shown in FIG. 13A, phosphorus doped amorphous silicon is deposited by the low pressure CVD process by for example a batch type device (deposition temperature of 530° C. and pressure of 150 Pa) at an upper layer of the etching stopper film 21 to a thickness of 100 nm to form the sidewall mask use layer 31. Amorphous silicon can be deposited with a good step coverage, therefore the thickness of the sidewall mask use layer 31 in the part facing the sidewall of the gate electrode 30 becomes 100 nm.

Figure 13B:
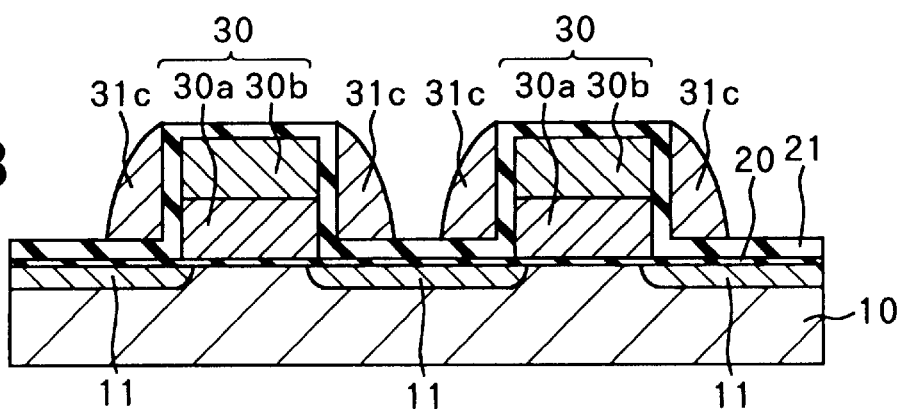

Next, as shown in FIG. 13B, the entire surface is etched back while leaving the sidewall mask use layer 31 at a position facing the sidewall portion of the gate electrode 30 by for example an etcher of an ECR type, a gas of $Cl_2$ at 100 SCCM, a pressure of 0.4 Pa, a microwave output at 2.45 GHz of 1200 W, an RF bias at 800 kHz of 80 W (first step)→30 W (second step), a wafer temperature of 20° C., and an over etching of 5% to form a sidewall mask layer 31c. At this time, the good step coverage of the sidewall mask use layer 31 is transferred, and the thickness of the sidewall mask layer 31c in the sidewall part of the gate electrode 30 becomes 100 nm.

Figure 13C:
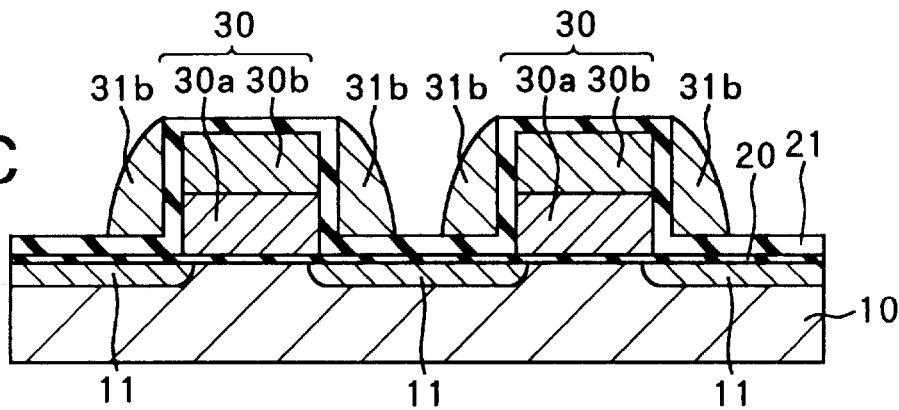

Next, as shown in FIG. 13C, heat treatment is applied under an oxygen atmosphere at a treatment temperature of 850° C. and treatment time of 20 minutes by using a commercially available heat treatment furnace. At this time, the amorphous silicon is crystallized to polycrystalline silicon and becomes a sidewall mask layer 31b in which the phosphorus or other internal conductive impurity is diffused and activated. The step coverage of the amorphous silicon is held well. By this heat treatment, the etching stopper film 21 is simultaneously densified, and also the conductive impurity in the LDD diffusion layer 11 is activated.

Figure 14A:
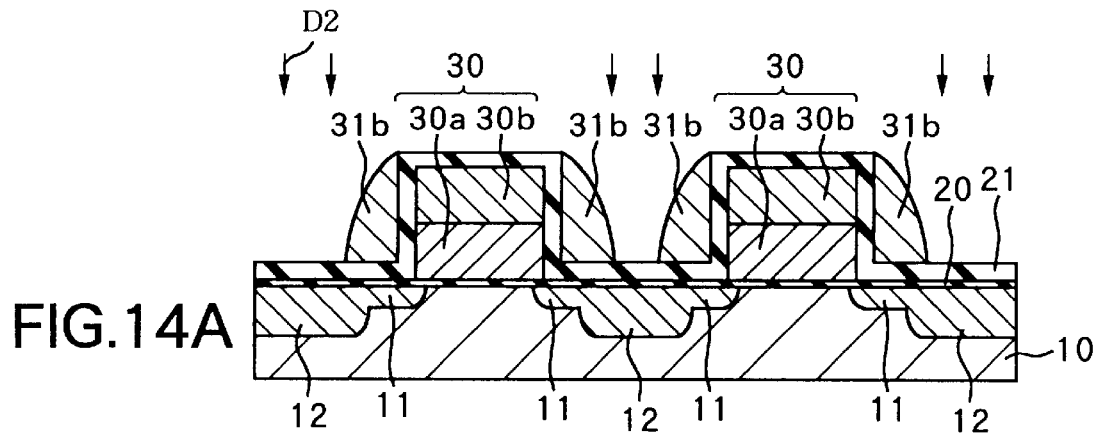

Next, as shown in FIG. 14A, a conductive impurity D2 is ion-implanted by using the sidewall mask layer 31b as a mask to form the source and drain diffusion layer 12 containing the conductive impurity at a high concentration while connected to the LDD diffusion layer 11. For example, when forming a p-channel type MOS field effect transistor, $BF_2^+$ is ion-implanted with an implantation energy of 50 keV and a dosage of $1\times10^{15}$ $cm^{-2}$, while when forming an n-channel type MOS field effect transistor, $As^+$ is ion-implanted with an implantation energy of 50 keV and a dosage of $5\times10^{15}$ $cm^{-2}$.

Figure 14B:
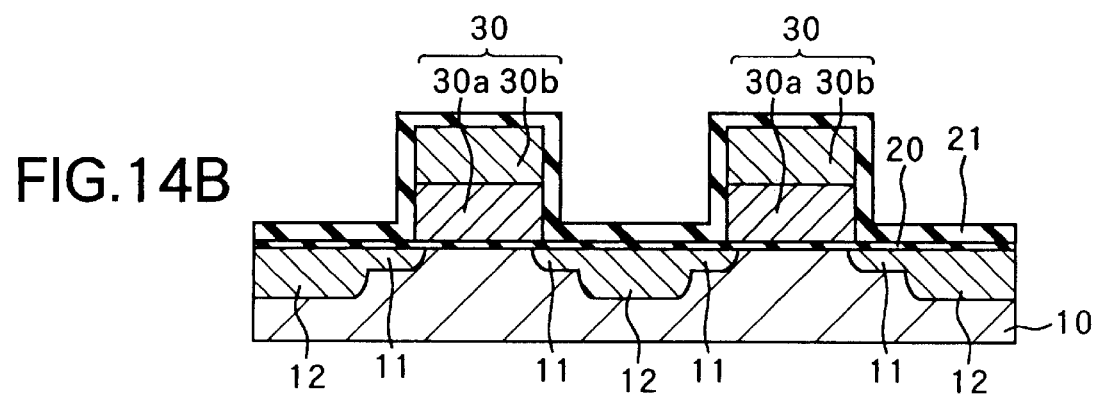

Next, as shown in FIG. 14B, the sidewall mask layer 31b is removed by etching by for example an etcher of a down flow type, a gas of $CF_4/O_2/Cl_2$ at 150/60/200 SCCM, a pressure of 40 Pa, a microwave output at 2.45 GHz of 700 W, a wafer temperature of 15° C., and an over etching of 100%. At this time, the ratio of the etching rate of the sidewall mask layer 31b with respect to the etching stopper film 21 is raised to about three times that of the related art, for example about 100, therefore gouging of the semiconductor substrate 10 due to the removal of part of the etching stopper film 21 or the formation of an opening penetrating to the semiconductor substrate 10 in the etching stopper film 21 is prevented.

Figure 14C:
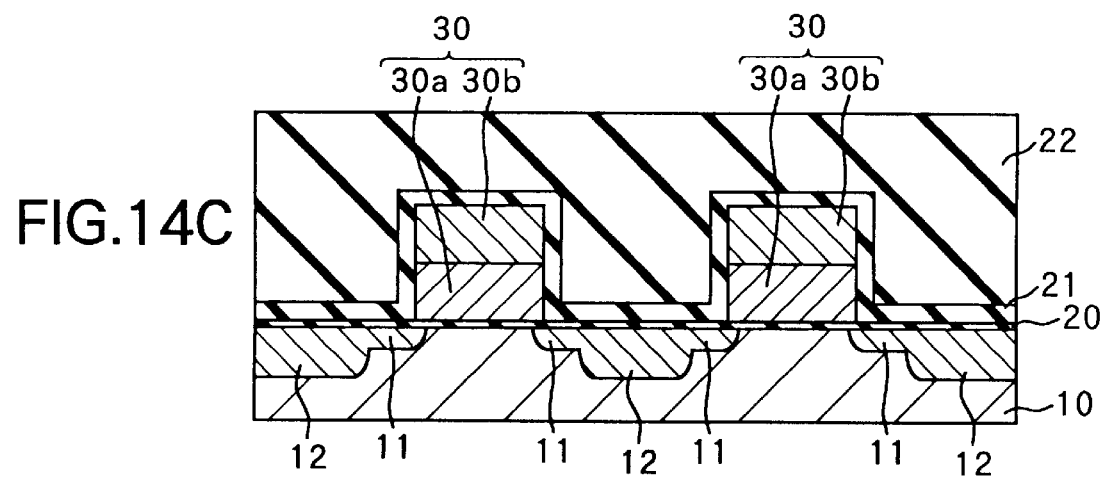

Next, as shown in FIG. 14C, silicon oxide is deposited by for example the CVD process to form the inter-layer insulating film 22. Next, the inter-layer insulating film 22 is flattened by for example the reflow, etch back, or CMP process.

Next, as shown in FIG. 15A, a resist film R of the opening pattern of the contact hole is formed at an upper layer of the inter-layer insulating film 2 by a photolithography step.

Next, as shown in FIG. 15B, etching is carried out using the resist film R as a mask by for example plasma etching of the ECR type to form a contact hole CH penetrating through the inter-layer insulating film 22, etching stopper film 21, and gate insulating film 20.

Next, a tungsten plug 32 is formed in the contact hole, then the upper layer interconnection 33 connected to the tungsten plug 32 is formed, whereby the semiconductor device shown in FIG. 4 is formed.

According to the method for producing a semiconductor device of the present embodiment, in the same way as the first embodiment, it is possible to activate the conductive impurity in the sidewall mask layer 31b by the heat treatment, further densify the etching stopper film by this heat treatment, and raise the etch selectivity of the sidewall mask layer 31b controlling the ratio of etching rate between the sidewall mask layer 31b and the etching stopper film 21. Therefore, when removing the sidewall mask layer 31b, the gouging of the semiconductor substrate 10 due to part of the etching stopper film 21 being removed before the removal of the sidewall mask layer 31b is terminated or part of the etching stopper film 21 being further removed and an opening portion penetrating to the semiconductor substrate 10 being formed can be prevented and stable removal of sidewall mask layer is possible. Further, the semiconductor substrate 10 and the not illustrated LOCOS element isolation insulating film etc. are covered by the etching stopper film 21, therefore damage due to the etchant ions directly abutting against the semiconductor substrate when removing the sidewall mask layer 31b or by etching of the bird's beak of the LOCOS film does not easily occur, so the device characteristics such as the leak current can be improved.

Fourth Embodiment

The semiconductor device produced by the method for producing a semiconductor device according to the fourth embodiment of the present invention is substantially the same as the semiconductor device according to the first embodiment shown in FIG. 4. this production method will be explained below. First, as shown in FIG. 12A, the gate insulating film 20 is formed on the silicon semiconductor substrate 10 by thermal oxidation, for example polycrystalline silicon is deposited to 100 nm by the low pressure CVD process, and for example tungsten silicide is deposited at an upper layer thereof to 100 nm by the plasma CVD process.

Next, a resist film of the intended gate pattern of 0.25 $\mu$m width is formed by patterning by using an excimer stepper, then etched by for example an etcher of an ICP type, a gas of $Cl_2/O_2$ at 100/5 SCCM, a pressure of 0.4 Pa, a source output at 13.56 MHZ of 2500 W, an RF bias at 13.56 MHZ of 100 W (first step)→50 W (second step), a wafer temperature of 60° C., and an over etching of 40% to form a gate electrode 30 of a polycide structure comprising the lower gate electrode 30a of polycrystalline silicon and the upper gate electrode 30b of tungsten silicide.

Next, as shown in FIG. 12B, a conductive impurity D1 is ion-implanted by using the gate electrode 30 as a mask to form an LDD diffusion layer 11 containing the conductive impurity at a low concentration For example, when forming a p-channel type MOS field effect transistor, $BF_2^+$ is ion-implanted with an implantation energy of 20 keV and a dosage of $2\times10^{13}$ $cm^{-2}$, while when forming an n-channel type MOS field effect transistor, $As^+$ is ion-implanted with an implantation energy of 40 keV and a dosage of $1\times10^{14}$ $cm^{-2}$.

Next, as shown in FIG. 12C, silicon oxide is deposited over the entire surface to a thickness of 30 nm covering the gate electrode 30 by the low pressure CVD process using for example TEOS as the staring material to form the etching stopper film 21.

Next, as shown in FIG. 13A, phosphorus doped amorphous silicon is deposited by the low pressure CVD process by for example a batch type device (deposition temperature of 530° C. and pressure of 150 Pa) at an upper layer of the etching stopper film 21 to a thickness of 100 nm to form the sidewall mask use layer 31. Amorphous silicon can be deposited with a good step coverage, therefore the thickness of the sidewall mask use layer 31 in the part facing the sidewall of the gate electrode 30 becomes 100 nm.

Next, as shown in FIG. 13B, the entire surface is etched back while leaving the sidewall mask use layer 31 at a position facing the sidewall portion of the gate electrode 30 by an etcher of the ICP type, a gas of $Cl_2$ at 200 SCCM, a pressure of 1.0 Pa, a source output at 13.56 MHZ of 2000 W, an RF bias at 13.56 MHZ of 100 W (first step)→30 W (second step), a wafer temperature of 60° C., and an over etching of 5% to form the sidewall mask layer 31c. At this time, the good step coverage of the sidewall mask use layer 31 is transferred, and the thickness of the sidewall mask layer 31c in the sidewall part of the gate electrode 30 becomes 100 nm.

Next, as shown in FIG. 13C, heat treatment is applied under a nitrogen atmosphere at a treatment temperature of 1000° C. and treatment time of 10 seconds using a commercially available RTA device. At this time, the amorphous silicon is crystallized to polycrystalline silicon and becomes a sidewall mask layer 31b in which the phosphorus or other internal conductive impurity is diffused and activated. The step coverage of the amorphous silicon is held well. By this heat treatment, the etching stopper film 21 is simultaneously densified and the conductive impurity in the LDD diffusion layer 11 is activated.

Next, as shown in FIG. 14A, a conductive impurity D2 is ion-implanted by using the sidewall mask layer 31b as a mask to form the source and drain diffusion layer 12 containing the conductive impurity at a high concentration while connected to the LDD diffusion layer 11. For example, when forming a p-channel type MOS field effect transistor, $BF_2^+$ is ion-implanted with an implantation energy of 50 keV and a dosage of $1\times10^{15}$ $cm^{-2}$, while when forming an n-channel type MOS field effect transistor, $As^+$ is ion-implanted with an implantation energy of 50 keV and a dosage of $5\times10^{15}$ $cm^{-2}$.

Next, as shown in FIGS. 14B, the sidewall mask layer 31b is removed by etching by for example an etcher of a down flow type, a gas of $CF_4/O_2/Cl_2$ at 150/60/200 SCCM, a pressure of 40 Pa, a microwave output at 2.45 GHz of 700 W, a wafer temperature of 15° C., and an over etching of 100%. At this time, the ratio of etching rate of the sidewall mask layer 31b with respect to the etching stopper film 21 is raised to about three times that of the related art, for example about 100, therefore the gouging of the semiconductor substrate 10 due to the removal of part of the etching stopper film 21 or the formation of an opening penetrating to the semiconductor substrate 10 in the etching stopper film 21 can be prevented.

Next, as shown in FIG. 14C, silicon oxide is deposited by for example the CVD process to form the inter-layer insulating film 22. Next, the inter-layer insulating film 22 is flattened by for example the reflow, etch back, or CMP process.

Next, as shown in FIG. 15A, a resist film R of the opening pattern of the contact hole is formed at an upper layer of the inter-layer insulating film 22 by the photolithography step.

Next, as shown in FIG. 15B, etching is carried out using the resist film R as a mask by for example plasma etching of the ICP type to form a contact hole CH penetrating through the inter-layer insulating film 22, etching stopper film 21, and gate insulating film 20.

Next, a tungsten plug 32 is formed in the contact hole, then the upper layer interconnection 33 connected to the tungsten plug 32 is formed, whereby the semiconductor device shown in FIG. 4 is formed.

According to the method for producing a semiconductor device of the present embodiment, in the same way as the first embodiment, it is possible to activate the conductive impurity in the sidewall mask layer 31b by the heat treatment, further densify the etching stopper film by this heat treatment, and raise the etch selectivity of the sidewall mask layer 31b controlling the ratio of etching rate between the sidewall mask layer 31b and the etching stopper film 21. Therefore, when removing the sidewall mask layer 31b, the gouging of the semiconductor substrate 10 due to part of the etching stopper film 21 being removed before the removal of the sidewall mask layer 31b is terminated or part of the etching stopper film 21 being further removed and an opening portion penetrating to the semiconductor substrate 10 being formed can be prevented and stable removal of sidewall mask layer is possible. Further, the semiconductor substrate 10 and the not illustrated LOCOS element isolation insulating film etc. are covered by the etching stopper film 21, therefore damage due to the etchant ions directly abutting against the semiconductor substrate when removing the sidewall mask layer 31b or by the etching of the bird's beak of the LOCOS film does not easily occur, so the device characteristics such as the leak current can be improved.

The present invention can be applied to all types of methods for production of semiconductor devices so long as they form contact holes in regions between narrow interval conductive layers formed on a semiconductor substrate, for example, DRAM and other MOS transistor semiconductor devices, bipolar type semiconductor devices, or A/D converters, more particularly can be preferably applied to a method for producing a semiconductor device having MOS field effect transistors using the conductive layers as gate electrodes.

The present invention is not limited to the embodiments. For example, there may be a single sidewall mask layer or multiple layers of the same. Further, the gate electrode may be a single layer or multiple layers and further can have an offset insulating film too. The etching stopper film can be formed also by silicon nitride etc. in addition to silicon oxide. Further, the conductive impurity contained in the sidewall mask layer can be ones other than phosphorus. Various other modifications can be made within a range within the gist of the present invention.

In summary, according to the present invention, there is provided a method for producing a semiconductor device using an etching stopper film and a silicon-based sidewall mask layer leading to dual usage together with SAC and improvement of the device characteristics and enabling stable removal of the sidewall mask layer.

What is claimed is:

1. A method for producing a semiconductor device comprising the steps of:
    forming a conductive layer on a semiconductor substrate whereby said conductive layer has a sidewall surface adjacent to a top surface;
    forming a first diffusion layer containing a conductive impurity at a first concentration in the semiconductor substrate by ion implantation using the conductive layer as a mask;
    forming a sidewall mask layer containing silicon over the etching stopper film facing the sidewall surface of the conductive layer;
    forming a sidewall mask layer containing silicon over the etching stopper film facing the sidewall surface of the conductive layer;
    forming a second diffusion layer containing a conductive impurity at a second concentration and connecting to the first diffusion layer in the semiconductor substrate by ion implantation using the sidewall mask layer as a mask;
    removing the sidewall mask layer selectively by etch controlling the ratio of etching rate between the sidewall mask layer and the etching stopper film;
    forming an insulating film over the etching stopper film; and
    forming a contact hole reaching the second diffusion layer through the insulating film,
    wherein at least the step of forming a sidewall mask layer or the step of forming a second diffusion layer includes a step of introducing a conductive impurity into the sidewall mask layer
    and, a heat treatment step for activating the conductive impurity in the sidewall mask layer before the step of removing the sidewall mask layer.

2. A method for producing a semiconductor device as set forth in claim 1, wherein the step of forming a sidewall mask layer includes a step of forming a sidewall mask layer containing a conductive impurity therein.

3. A method for producing a semiconductor device as set forth in claim 1, wherein the treatment temperatue in the heat treatment step is higher than the film-forming temperature of the step of forming a sidewall mask layer.

4. A method for producing a semiconductor device as set forth in claim 1, wherein the step of forming a sidewall mask layer includes a step of forming a sidewall mask use layer over the etching stopper film and a step of etching back the sidewall mask use layer leaving the sidewall mask use layer at a portion facing the sidewall surface of the conductive layer.

5. A method for producing a semiconductor device as set forth in claim 4, wherein the step of forming a sidewall mask use layer includes a step of forming a sidewall mask use layer containing a conductive impurity therein.

6. A method for producing a semiconductor device as set forth in claim 4, wherein the treatment temperature in the heat treatment step is higher than the film-forming temperature of the step of forming a sidewall mask use layer.

7. A method for producing a semiconductor device as set forth in claim 1, wherein the step of forming a sidewall mask layer includes a step of forming a sidewall mask layer of amorphous silicon.

8. A method for producing a semiconductor device as set forth in claim 1, wherein the heat treatment step includes a step of activating the conductive impurity in at least one of the first diffusion layer and the second diffusion layer.

9. A method for producing a semiconductor device as set forth in claim 1, further comprising a step of forming a channel formation region in the semiconductor substrate and a step of forming a gate insulating film over the semiconductor substrate before the step of forming a conductive layer in the semiconductor substrate,
    the step of forming a conductive layer including a step of forming a conductive layer over the gate insulating film, and
    a field-effect transistor using the conductive layer as a gate electrode being formed.

* * * * *